(12) United States Patent
Sato

(10) Patent No.: US 9,768,205 B2
(45) Date of Patent: Sep. 19, 2017

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/236,629

(22) Filed: Aug. 15, 2016

(65) Prior Publication Data

US 2017/0053951 A1    Feb. 23, 2017

(30) Foreign Application Priority Data

Aug. 19, 2015   (JP) .................................. 2015-161982

(51) Int. Cl.
| H01L 27/12 | (2006.01) |
|---|---|
| H01L 29/786 | (2006.01) |
| H01L 27/32 | (2006.01) |

(52) U.S. Cl.
CPC ........ *H01L 27/1255* (2013.01); *H01L 27/124* (2013.01); *H01L 27/1218* (2013.01); *H01L 29/78603* (2013.01); *H01L 29/78645* (2013.01); *H01L 29/78648* (2013.01); *H01L 29/78696* (2013.01); *H01L 27/3262* (2013.01)

(58) Field of Classification Search
CPC .............. H01L 27/1255; H01L 27/124; H01L 27/1218
See application file for complete search history.

(56) References Cited

U.S. PATENT DOCUMENTS

| 2004/0217422 A1 | 11/2004 | Choi et al. |
|---|---|---|
| 2007/0228398 A1 | 10/2007 | Choi et al. |
| 2007/0228441 A1 | 10/2007 | Choi et al. |
| 2007/0231977 A1 | 10/2007 | Choi et al. |

FOREIGN PATENT DOCUMENTS

| JP | H05-114732 A | 5/1993 |
|---|---|---|
| JP | 2004-327979 A | 11/2004 |
| JP | 2006-245371 A | 9/2006 |
| JP | 2007-220783 A | 8/2007 |
| JP | 2009-043748 A | 2/2009 |
| JP | 2009-152487 A | 7/2009 |

*Primary Examiner* — Douglas Menz
(74) *Attorney, Agent, or Firm* — Typha IP LLC

(57) ABSTRACT

A display device includes a pixel including a thin film transistor, and an under layer below the thin film transistor. The thin film transistor includes a first gate electrode, a semiconductor layer and a second gate electrode. The semiconductor layer includes a channel region that overlaps at least one of the first gate electrode and the second gate electrode in a plan view. The channel region curves in a thickness direction of the semiconductor layer. The first gate electrode includes a first edge located on the side of an edge of the channel region in a direction of a channel length. The second gate electrode includes a second edge located on the side of the edge of the channel region. The position of the first edge is different from the position of the second edge in the direction of the channel length.

20 Claims, 19 Drawing Sheets

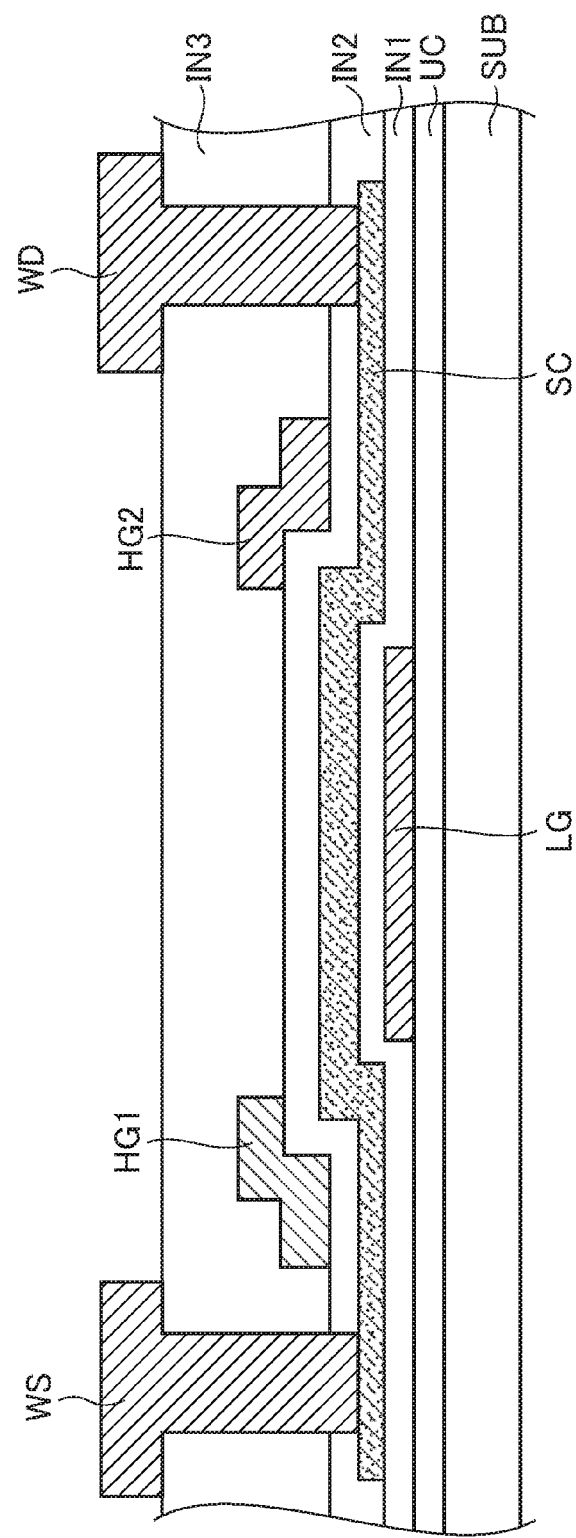

DISPLAY DEVICE

CROSS-REFERENCE TO RELATED APPLICATION

The present application claims priority from Japanese application JP2015-161982 filed on Aug. 19, 2015, the content of which is hereby incorporated by reference into this application.

BACKGROUND OF THE INVENTION

1. Field of the Invention

The present invention relates to a display device.

2. Description of the Related Art

A display device configured of pixels including thin film transistors, such as a liquid crystal display device or an organic EL display device, has become widespread.

JP 2009-043748 A discloses a thin film transistor including a back gate electrode located below a semiconductor layer and a front gate electrode located above the semiconductor layer, in which the same potential is applied to the back gate electrode and the front gate electrode. JP H05-114732 A discloses a thin film transistor provided with a gate electrode above a semiconductor thin film and a back gate electrode below the semiconductor thin film. JP 2004-327979A discloses a thin film transistor including a power supply layer formed in an active layer so as to be in contact with a channel region and separated from source/drain regions and supplying a predetermined voltage to a channel. JP 2006-245371 A discloses a thin film transistor in which the upper surfaces of a gate electrode and an insulating layer include quadratic prism-shaped projections or recesses parallel to a direction connecting a source electrode to a drain electrode. JP 2009-152487 A discloses a thin film transistor including a metal layer facing a semiconductor layer and having irregularities formed on the metal layer. JP2007-220783A discloses a field-effect transistor employing an aspect in which a plurality of grooves are formed in a channel region between a source and a drain to thereby increase an effective channel area.

SUMMARY OF THE INVENTION

Higher resolution is demanded of the display device in recent years, and thus the size of the pixel becomes small. As the pixel becomes small, the space for disposing the thin film transistor is reduced. Therefore, a phenomenon that deteriorates a characteristic to control a current with the thin film transistor, such as a kink phenomenon, is likely to occur. The kink phenomenon is a phenomenon in which the Vd-Id characteristics become different from those of general thin film transistors and which is also called an impact ion phenomenon in which a large amount of hot electrons are produced by a strong electric field at a drain end. In the kink phenomenon, a hole accumulation state is established in which excessive holes at this time are accumulated under the gate. When the characteristic deterioration described above is caused, the characteristics of thin film transistors vary greatly, and thus image quality is deteriorated.

The invention has been made in view of the problems described above, and it is an object of the invention to provide a technique that suppresses a deterioration in the characteristics of a thin film transistor and improves image quality of a display device.

An outline of representative aspects of the invention disclosed herein will be briefly described below.

A display device according to an aspect of the invention includes: a pixel including a thin film transistor; and an under layer provided below the thin film transistor. The thin film transistor includes a first gate electrode provided on the under layer, a semiconductor layer provided above the first gate electrode, and a second gate electrode provided above the semiconductor layer; the semiconductor layer includes a channel region that overlaps at least one of the first gate electrode and the second gate electrode in a plan view; the channel region curves in a thickness direction of the semiconductor layer; the first gate electrode includes a first edge located on the side of an edge of the channel region in a direction of a channel length of the thin film transistor; the second gate electrode includes a second edge located on the side of the edge of the channel region; and the position of the first edge in the direction of the channel length is different from the position of the second edge in the direction of the channel length in the plan view.

A display device according to another aspect of the invention includes: a pixel including a thin film transistor; and an under layer provided below the thin film transistor. The thin film transistor includes a first gate electrode provided on the under layer, a first semiconductor layer provided above the first gate electrode, and a second gate electrode provided above the first semiconductor layer; the first semiconductor layer includes a channel region that overlaps at least one of the first gate electrode and the second gate electrode in a plan view; a first gate insulating film is disposed between the first gate electrode and the first semiconductor layer; a second gate insulating film is disposed between the semiconductor layer and the second gate electrode; a second semiconductor layer located separately from the first semiconductor layer is disposed in the same layer as the first semiconductor layer; the first gate electrode includes a first portion that overlaps the second semiconductor layer in the plan view; the second gate electrode includes a second portion that overlaps the first portion in the plan view; the first gate insulating film is located between the first portion and the second semiconductor layer; the second gate insulating film is located between the second semiconductor layer and the second portion; the first gate electrode includes a first edge located on the side of an edge of the channel region in a direction of a channel length of the thin film transistor; the second gate electrode includes a second edge located on the side of the edge of the channel region; and the position of the first edge in the direction of the channel length is different from the position of the second edge in the direction of the channel length in the plan view.

According to the aspects of the invention, it is possible to suppress a deterioration in the characteristics of the thin film transistor and improve image quality of the display device.

BRIEF DESCRIPTION OF THE DRAWINGS

FIG. 19 is a cross-sectional view along the section line XIX-XIX of FIG. 18.

DETAILED DESCRIPTION OF THE INVENTION

Figure 1:
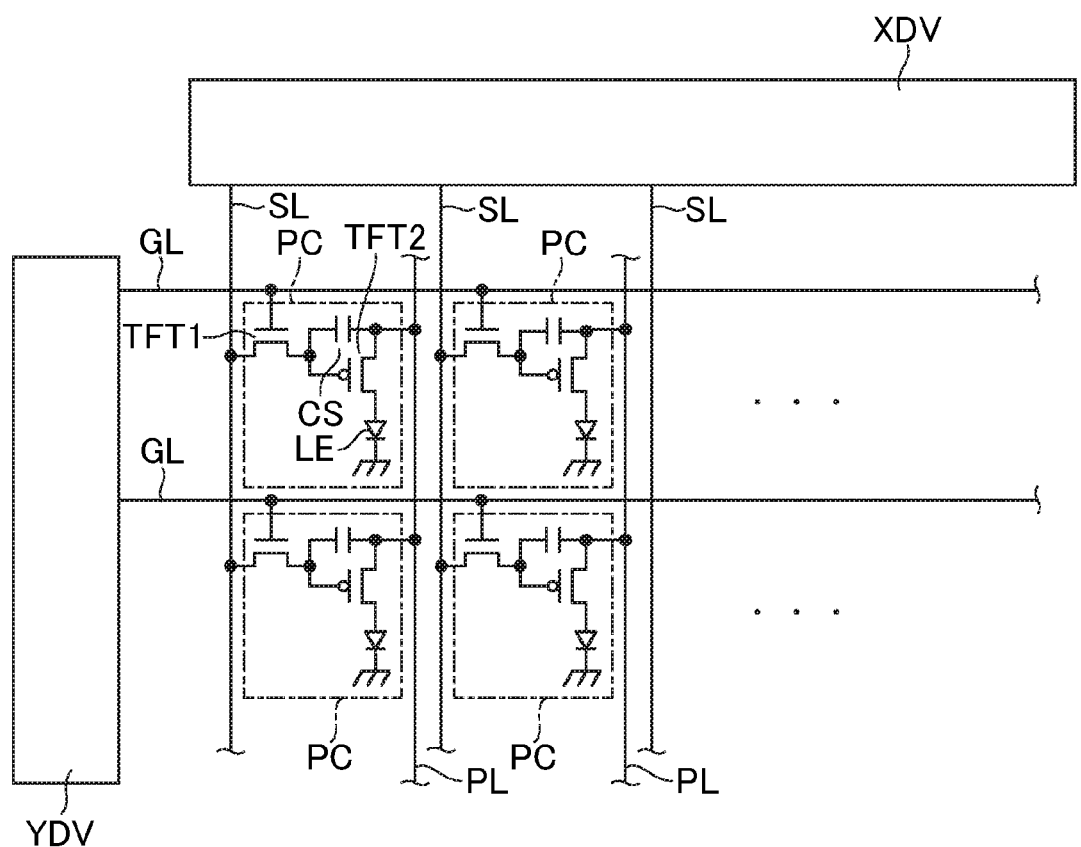
FIG. 1 is a circuit diagram showing one example of an equivalent circuit of an organic EL display device according to a first embodiment.

Hereinafter, embodiments of the invention will be described based on the drawings. Components appearing herein with the same function are denoted by the same reference characters, and the description thereof is omitted. As the embodiments of the invention, examples of applying the invention to an organic EL display device as one type of display device will be described below. However, the display device may be another type of display device including a pixel circuit including thin film transistors, such as a liquid crystal display device. Moreover, for the thin film transistor (TFT) described in the invention, so-called low-temperature polysilicon (LTPS), oxide semiconductor (TAOS), amorphous silicon (a-Si), high-temperature polysilicon, or the like may be used. Further, the display device may be configured of the above-described plurality of different TFT elements combined together in a pixel circuit or a peripheral circuit.

First Embodiment

An organic EL display device according to a first embodiment of the invention includes an array substrate SUB (see FIG. 3), a counter substrate facing the array substrate SUB, a flexible circuit board connected to the array substrate SUB, and a driver integrated circuit. Color filters are provided on the counter substrate, and full-color display is realized by combinations of the color filters and white organic light-emitting diodes (OLEDs). Instead of the white OLEDs, light-emitting elements that emit light of respective colors of RGB or the like may be used, in which case the counter substrate and the color filters may not be present.

FIG. 1 is a circuit diagram showing one example of an equivalent circuit of the organic EL display device according to the first embodiment. The circuit shown in FIG. 1 is physically formed on the array substrate SUB (see FIG. 3) or in the driver integrated circuit. A plurality of pixel circuits PC, a plurality of gate signal lines GL, a plurality of data signal lines SL, and power lines PL are disposed on the array substrate SUB. The plurality of pixel circuits PC are disposed in a matrix in a display area of the array substrate SUB. Each of the pixel circuits PC corresponds to one display pixel. One pixel of an image may be expressed by a plurality of display pixels which are different in color from each other. One gate signal line GL is provided for each row of pixel circuits PC, and each gate signal line GL is connected to the pixel circuits PC constituting the corresponding row. One data signal line SL is provided for each column of pixel circuits PC, and each data signal line SL is connected to the pixel circuits PC constituting the corresponding column. One end of each of the plurality of gate signal lines GL is connected to a driver circuit YDV, while one end of each of the plurality of data signal lines SL is connected to a driver circuit XDV. The driver circuit YDV outputs a scanning signal to the gate signal line GL, while the driver circuit XDV supplies the potential of an image signal corresponding to a display gray scale of the pixel to the data signal line SL.

Each of the pixel circuits PC includes a thin film transistor TFT1, a thin film transistor TFT2, a capacitor CS, and a light-emitting element LE. The thin film transistor TFT1 is turned on in response to the scanning signal supplied from the gate signal line GL, and at that time, the capacitor CS is caused to store the potential based on the image signal supplied from the data signal line SL. The thin film transistor TFT2 controls the amount of current flowing between a source and a drain based on a potential difference stored in the capacitor CS. The light-emitting element LE is an OLED, and emits light with a luminance according to the amount of current controlled by the thin film transistor TFT2. The thin film transistor TFT2 is of P-channel type; therefore, a source electrode of the thin film transistor TFT2 is connected to the power line PL, while a drain electrode thereof is connected to the light-emitting element LE. The capacitor CS is provided between a gate electrode of the thin film transistor TFT2 and the source electrode thereof. The pixel circuit PC is not limited to one that adjusts the luminance of the light-emitting element LE by controlling the current applied to the light-emitting element LE as shown in FIG. 1. There may be a pixel circuit PC in which the thin film transistor TFT2 controls the voltage applied to the light-emitting element LE to thereby adjust the luminance of the light-emitting element LE.

Figure 2:
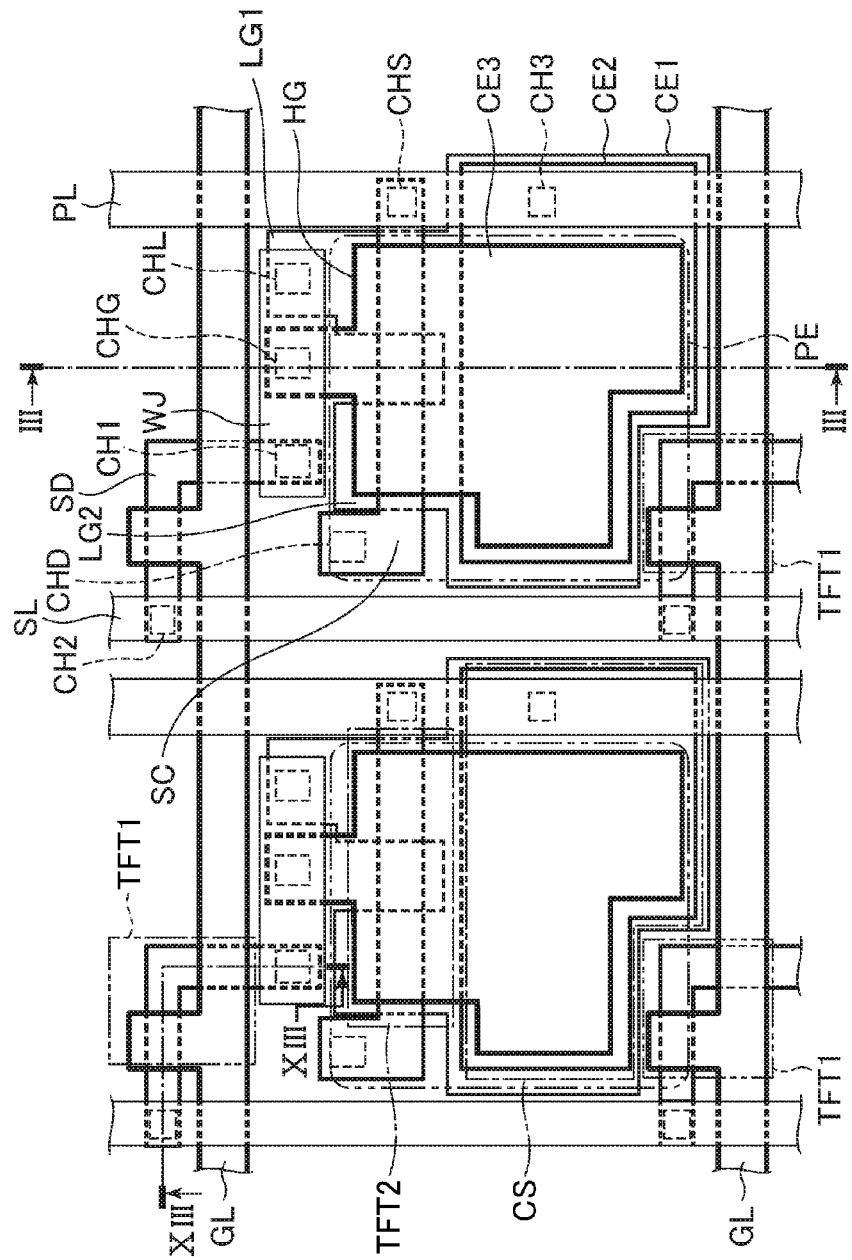
FIG. 2 is a plan view showing one example of a pixel circuit according to the first embodiment.
Figure 3:
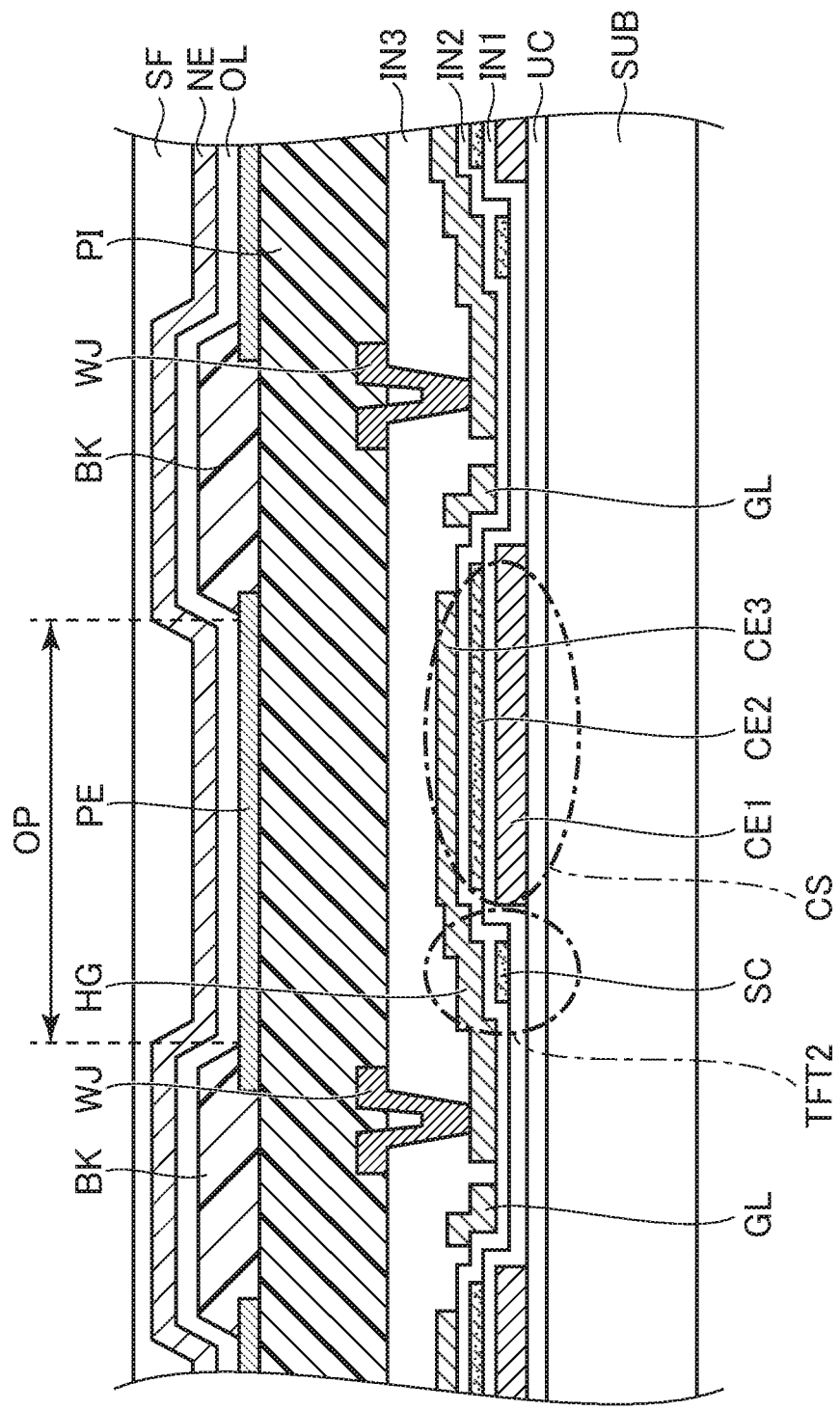
FIG. 3 is a cross-sectional view of a thin film transistor shown in FIG. 2 along the section line

FIG. 2 is a plan view showing one example of the pixel circuit PC according to the first embodiment. FIG. 3 is a cross-sectional view of the pixel circuit PC shown in FIG. 2 along the section line III-III. Each of the pixel circuits PC is mainly disposed in a region surrounded by the data signal lines SL next to each other and the gate signal lines GL next to each other. The power line PL is adjacent to the left of each of the data signal lines SL, and extends in the longitude direction. In the region on the array substrate SUB where the pixel circuit PC is formed, channel semiconductor films SC and SD, an upper gate electrode HG, lower gate electrodes LG1 and LG2, a first capacitor electrode CE1, a second capacitor electrode CE2, a third capacitor electrode CE3, an anode PE, and a bank BK (see FIG. 3) including a bank opening OP formed therein are disposed as elements constituting the pixel circuit PC. The channel semiconductor film SD constitutes the thin film transistor TFT1 together with a portion of the gate signal line GL located above the channel semiconductor film SD. The channel semiconductor film SC, the upper gate electrode HG, and the lower gate electrodes LG1 and LG2 constitute the thin film transistor TFT2. The first capacitor electrode CE1, the second capacitor electrode CE2, and the third capacitor electrode CE3 constitute the capacitor CS. One of electrodes of the capacitor CS corresponds to the second capacitor electrode CE2, and the other electrode corresponds to the first capacitor electrode CE1 and the third capacitor electrode CE3. The first capacitor electrode CE1 is formed integrally with the lower gate electrodes LG1 and LG2; the second capacitor electrode CE2 is electrically connected to the channel semiconductor film SC through the power line PL; and the third capacitor electrode CE3 is formed integrally with the upper gate electrode HG. The lower gate electrodes LG1 and LG2 and the upper gate electrode HG are electrically connected. A gate insulating layer IN1 and a gate insulating layer IN2 correspond to inter-electrode dielectric layers of the capacitor CS. The gate insulating layer IN1 is disposed between the second capacitor electrode CE2 as the one electrode of the capacitor CS and the first capacitor electrode CE1 as the other electrode. The gate insulating layer IN2 is disposed between the second capacitor electrode CE2 as the one electrode of the capacitor CS and the third capacitor electrode CE3 as the other electrode As shown in FIG. 3, an under layer UC, a first conductive layer described later, the first gate insulating layer IN1, a semiconductor layer described later, the second gate insulating layer IN2, a second conductive layer described later, an inter-layer insulating layer IN3, a third conductive layer described later, a planarizing layer PI, a layer including the anode PE, and a layer including the bank BK are sequentially stacked on the array substrate SUB. Moreover, an OLED layer OL, a cathode layer NE, and a sealing layer SF are stacked on the layer including the bank BK. A portion where the bank BK is absent is referred to as the "bank opening OP". In the bank opening OP, the anode PE is exposed from the bank BK, and the anode PE and the OLED layer are in contact with each other. In a portion that overlaps the bank opening OP in a plan view, electricity flows between the anode PE and the cathode layer NE to cause the OLED layer OL to emit light. The anode PE, the OLED layer OL, and the sealing layer SF that are located in the portion overlapping the bank opening OP constitute the light-emitting element LE. The first conductive layer includes the lower gate electrodes LG1 and LG2 and the first capacitor electrode CE1. The semiconductor layer includes the channel semiconductor film SC, the channel semiconductor film SD (see FIG. 2), and the second capacitor electrode CE2. The second conductive layer includes the gate signal line GL, the upper gate electrode HG, and the third capacitor electrode CE3. The third conductive layer includes a jumper wiring WJ, the power line PL (see FIG. 2), and the data signal line SL (see FIG. 2). Since the anode PE and the OLED layer are in contact with each other, the region of the bank opening OP serves as a light-emitting region where an organic EL element emits light.

The channel semiconductor film SD is connected through a contact hole CH2 with the data signal line SL on the further upper side of the gate signal line GL located on the upper side of FIG. 2 as viewed from the center of the pixel circuit PC. The channel semiconductor film SD extends from the position of the contact hole CH2 in the right direction in the drawing, passes under a protrusion of the gate signal line GL extending upward in FIG. 2, is directed in the lower direction, passes under the gate signal line GL, and extends to a portion beyond the gate signal line GL. A contact hole CH1 is formed in the upper layer on the extended tip portion of the channel semiconductor film SD.

The channel semiconductor film SC extends, slightly above the center of the pixel circuit PC as viewed in FIG. 2, in lateral direction of the drawing. The right end of the channel semiconductor film SC is connected with the power line PL through a contact hole CHS. The left end of the channel semiconductor film SC slightly bends upward, and the bent tip is connected with the anode PE through a contact hole CHD. The lower gate electrodes LG1 and LG2 and the upper gate electrode HG are provided so as to planarly overlap the left-to-right extending region of the channel semiconductor film SC excepting the ends. In a plan view, a region where the lower gate electrode LG1 and the channel semiconductor film SC overlap and a region where the lower gate electrode LG2 and the channel semiconductor film SC overlap are separated from each other. As viewed in a direction in which the channel semiconductor film SC extends, the lower gate electrode LG1 is disposed on the contact hole CHS side (source side of the thin film transistor TFT2), while the lower gate electrode LG2 is disposed on the contact hole CHD side (drain side of the thin film transistor TFT2). The lower gate electrode LG1 and the lower gate electrode LG2 are connected on the lower side of the channel semiconductor film SC as viewed in FIG. 2. The upper gate electrode HG projects upward in FIG. 2 as viewed from the channel semiconductor film SC. The projecting portion is connected with the jumper wiring WJ located in the upper layer through a contact hole CHG. The jumper wiring WJ is connected to the channel semiconductor film SD through the contact hole CH1, and connected to the lower gate electrode LG1 through a contact hole CHL.

The first capacitor electrode CE1 extends upward from the lower edge of the pixel circuit PC (see FIG. 1) as viewed in FIG. 2, and has a shape provided with a notch in the lower left region where the thin film transistor TFT1 is located. Moreover, the first capacitor electrode CE1 and the second capacitor electrode CE2 extend from the inside of the pixel circuit PC to a portion under the power line PL. The first capacitor electrode CE1 and the lower gate electrodes LG1 and LG2 are integrated together on the lower side of the channel semiconductor film SC as viewed in FIG. 2. The second capacitor electrode CE2 is provided so as to face and planarly overlap the first capacitor electrode CE1, and extends from slightly above the lower edge of the first capacitor electrode CE1 to the side where the lower gate electrodes LG1 and LG2 are located as viewed in FIG. 2. The second capacitor electrode CE2 is connected to the power line PL through a contact hole CH3. With this configuration, the source of the thin film transistor TFT2 and the second capacitor electrode CE2 are electrically connected through the power line PL. Here, the second capacitor electrode CE2 may be directly connected with the source-side end of the channel semiconductor film SC. The third capacitor electrode CE3 extends upward from slightly above the lower edge of the second capacitor electrode CE2 as viewed in FIG. 2. The third capacitor electrode CE3 has a shape provided with a notch in the lower left region where the thin film transistor TFT1 is located. The third capacitor electrode CE3 and the upper gate electrode HG are integrated together. The boundary between the third capacitor electrode CE3 and the upper gate electrode HG is located between the channel semiconductor film SC and the second capacitor electrode CE2. The third capacitor electrode CE3 is separated from the power line PL.

The first capacitor electrode CE1 and the third capacitor electrode CE3 are electrically connected through the jumper wiring WJ, the lower gate electrode LG1, and the upper gate electrode HG. With this configuration, the capacitor CS has a sandwich structure, so that the capacitance of the capacitor CS is larger than that obtained when simply using two facing electrodes.

Figure 4:
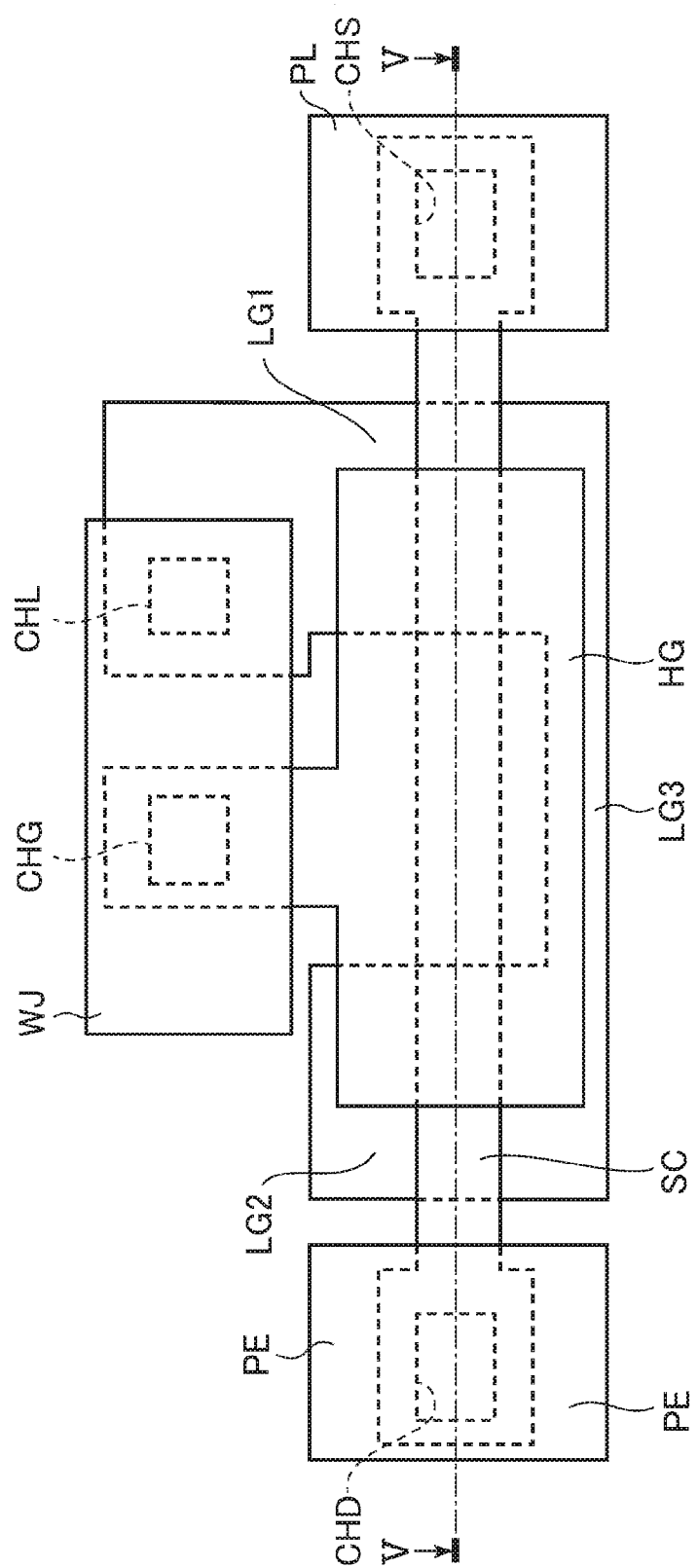
FIG. 4 is a plan view showing one example of the thin film transistor according to the first embodiment.
Figure 5:
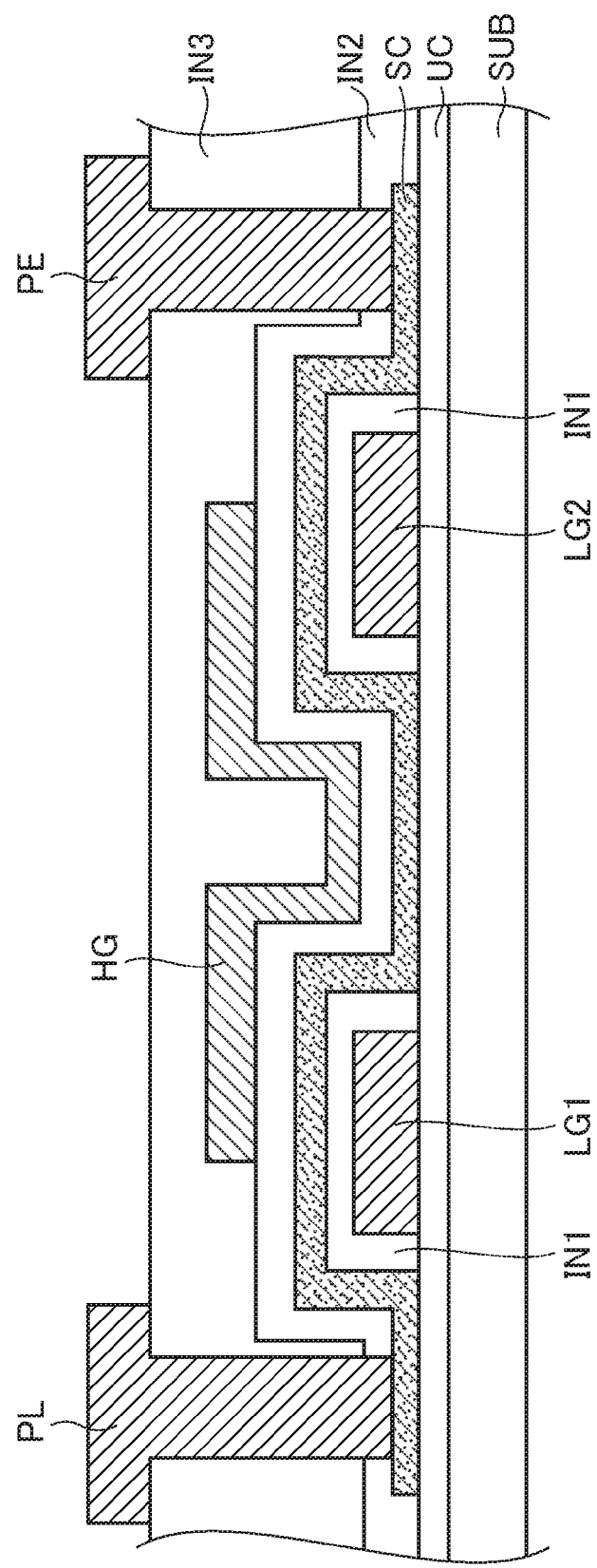
FIG. 5 is a cross-sectional view along the section line V-V of FIG. 4.

Next, the structure of the thin film transistor TFT2 will be described in further detail. FIG. 4 is a plan view showing, in a simplified manner, the thin film transistor TFT2 according to the first embodiment. FIG. 5 is a cross-sectional view of the thin film transistor TFT2 shown in FIG. 4 along the section line V-V. FIGS. 4 and 5 are diagrams corresponding to the thin film transistor TFT2 alone, excluding the electrodes constituting the capacitor CS.

The thin film transistor TFT2 shown in FIG. 4 includes the lower gate electrodes LG1 and LG2 and a lower gate electrode LG3 provided on the under layer UC, the channel semiconductor film SC, and the upper gate electrode HG. The channel semiconductor film SC is provided above the lower gate electrodes LG1 and LG2, and the upper gate electrode HG is provided above the channel semiconductor film SC. The channel semiconductor film SC extends from a drain end in contact with the anode PE through the contact hole CHD to a source end in contact with the power line PL through the contact hole CHS. A channel portion located between the source end and the drain end has a band shape in a plan view. Herein, in the region of the channel semiconductor film SC from the source end to the drain end, a portion that planarly overlaps any of the lower gate electrodes LG1 and LG2 and the upper gate electrode HG is described as "channel region", a portion on the drain end side in a region of the channel semiconductor film SC that is not the channel region is described as "drain region", and a region on the source end side is described as "source region".

The lower gate electrodes LG1 and LG2 and the upper gate electrode HG constitute a gate electrode of the thin film transistor TFT2. In the example of FIG. 4, in a plan view, the lower gate electrodes LG1 and LG2 are rectangular regions that are separated from each other, and the lower gate electrodes LG1 and LG2 are continuously connected with the lower gate electrode LG3 on the lower side of FIG. 4. The lower gate electrode LG1 is in contact with the jumper wiring WJ through the contact hole CHL on the upper side of FIG. 4. The upper gate electrode HG is in contact with the jumper wiring WJ through the contact hole CHG on the upper side of FIG. 4. With this configuration, the upper gate electrode HG and the lower gate electrodes LG1 and LG2 are electrically connected. Moreover, the lower gate electrodes LG1 and LG2 face the channel semiconductor film SC with the gate insulating layer IN1 therebetween, and the upper gate electrode HG faces the channel semiconductor film SC with the gate insulating layer IN2 therebetween. A direction along the channel length of the thin film transistor TFT2 is the same as the direction in which the channel semiconductor film SC extends from the source region toward the drain region.

The under layer UC is formed below the thin film transistor TFT2. The under layer UC and the lower gate electrodes LG1 and LG2 forma recess under the channel region of the channel semiconductor film SC. More specifically, the lower gate electrodes LG1 and LG2 are absent under a portion of the channel region located between the lower gate electrode LG1 and the lower gate electrode LG2, so that the recess (irregularities) is formed. Moreover, a projection that corresponds to the recess and projects to the side of the under layer UC is formed in the channel region on the recess. When viewed in another perspective, projections projecting to the side of the upper gate electrode HG are formed in the channel region on the lower gate electrodes LG1 and LG2 due to the thickness of the lower gate electrodes LG1 and LG2.

The channel region of the channel semiconductor film SC includes: an overlapped facing region where the channel region faces both the upper gate electrode HG and any of the lower gate electrodes LG1 and LG2; and a one-side facing region where the channel region faces only one of the lower gate electrodes LG1 and LG2 and the upper gate electrode HG and which is located outside the overlapped facing region as viewed in the direction along the channel length. Moreover, as viewed in the direction along the channel length, the one-side facing region is present on the side of the overlapped facing region opposite to the central portion of the channel region. In another perspective, as viewed in the direction along the channel length, the positions of the edges of the lower gate electrodes LG1 and LG2 are shifted from the positions of the edges of the upper gate electrode HG. In the example of FIG. 4, one of the edges of each of the lower gate electrodes LG1 and LG2 is located outside the edges of the upper gate electrode HG; however, the edges of the upper gate electrode HG may be located outside the edges of the lower gate electrodes LG1 and LG2. That is, a structure may be employed in which, in a plan view, the edges of the lower gate electrodes LG1 and LG2 overlap the edges of the channel region and the edges of the upper gate electrode HG are located inside the edges of the channel region. Also, a structure may be employed in which, in a plan view, the edges of the upper gate electrode HG overlap the edges of the channel region and the edges of the lower gate electrodes LG1 and LG2 are located inside the edges of the channel region.

In the embodiment, the gate electrodes electrically connected are disposed above and below the channel region, so that an electric field can be applied to the channel from above and below. Therefore, compared with the case where the gate electrode is disposed only on one side, the thin film transistor TFT2 can be driven at a lower voltage. Further, due to the irregularities formed in the channel region, an effective channel length is lengthened. Moreover, since the positions of the edges of the lower gate electrodes LG1 and LG2 are shifted from the position of the edge of the upper gate electrode HG, an electric field at the edge of the channel region as viewed in the direction along the channel length is relaxed. With these configurations, impact ions at the drain end are reduced, and thus it is possible to suppress the occurrence of a kink phenomenon. Moreover, if the kink phenomenon is avoided, variations in luminance among pixels can be suppressed.

Further, the upper gate electrode HG is used as the third capacitor electrode CE3; the semiconductor film in the same layer as the channel semiconductor film SC is used as the second capacitor electrode CE2; and the lower gate electrodes LG1, LG2, and LG3 are used as the first capacitor electrode CE1. Since both a region between the third capacitor electrode CE3 and the second capacitor electrode CE2 and a region between the second capacitor electrode CE2 and the first capacitor electrode CE1 can be used as capacitance forming regions, the capacitor CS can obtain a large capacitance value with a small plane area. Further, since the layers used for the thin film transistor TFT2 are used, as they are, also for the capacitor, there is no need to newly provide an additional layer.

Figure 13:
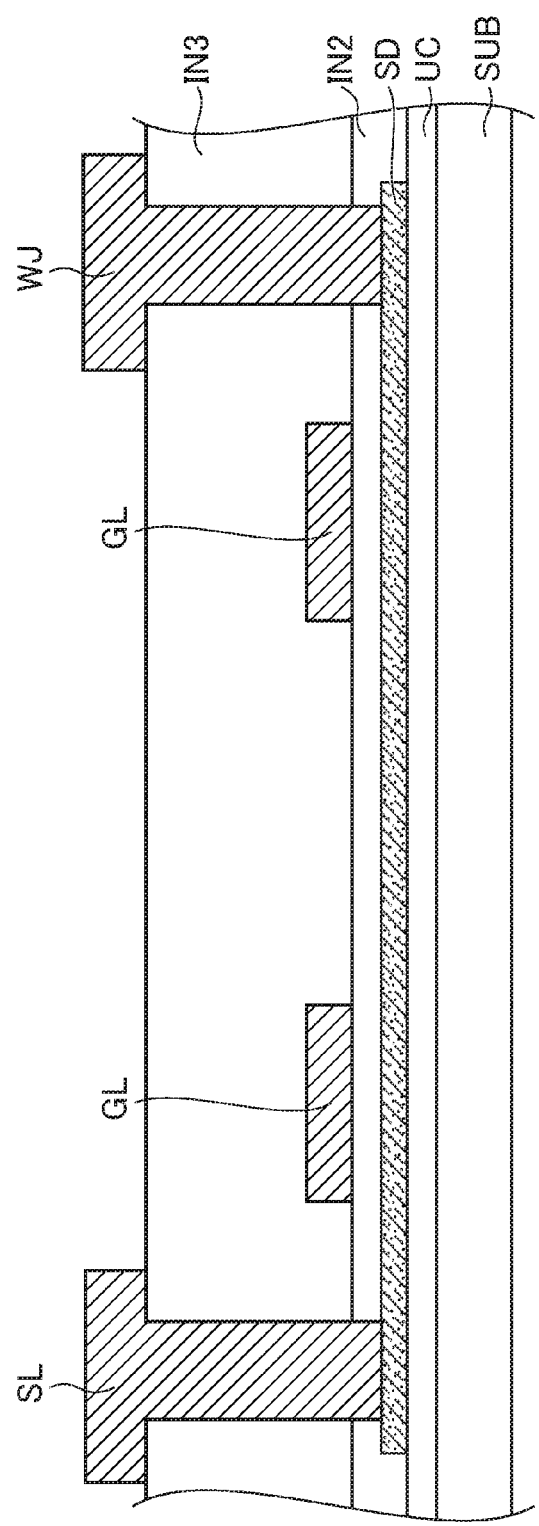
FIG. 13 is a cross-sectional view along the section line XIII-XIII of FIG. 2.

FIG. 13 is a cross-sectional view along the section line XIII-XIII of FIG. 2. The thin film transistor TFT1 includes the data signal line SL as a drain electrode, the jumper wiring WJ as a source electrode, the gate signal line GL as a gate electrode, and the channel semiconductor film SD. The channel semiconductor film SD is formed such that the entire lower surface thereof is in contact with the under layer UC. The upper surface of the drain-side end of the channel semiconductor film SD is in contact with the data signal line SL through the contact hole CH2, and the upper surface of the source-side end of the channel semiconductor film SD is in contact with the jumper wiring WJ through the contact hole CH1. The contact holes CH1 and CH2 are formed in the gate insulating layer IN2 and the inter-layer insulating layer IN3. The upper side of the channel semiconductor film SD faces at two places the gate signal line GL with the gate insulating film IN2 therebetween. The thin film transistor TFT1 includes the gate electrode formed only on the upper side of the channel semiconductor film SD, and therefore has a simpler configuration than the thin film transistor TFT2. Moreover, the disposed area of the thin film transistor TFT1 is smaller than the thin film transistor TFT2.

Since the thin film transistor TFT1 is used as a switch and only operates to control turning on or off, the thin film transistor TFT1 is less likely to suffer from problems even with a simple configuration. On the other hand, the thin film transistor TFT2 controls, for example, the voltage between the gate and the source to thereby control the amount of current between the source and the drain. By employing the above-described structure for a transistor that controls the amount of current or the like in an analog fashion like the thin film transistor TFT2 and employing a simple structure for a transistor that operates as a simple switch, it is possible to suppress an increase in the area of the pixel circuit while effectively suppressing a kink effect.

Figure 6:
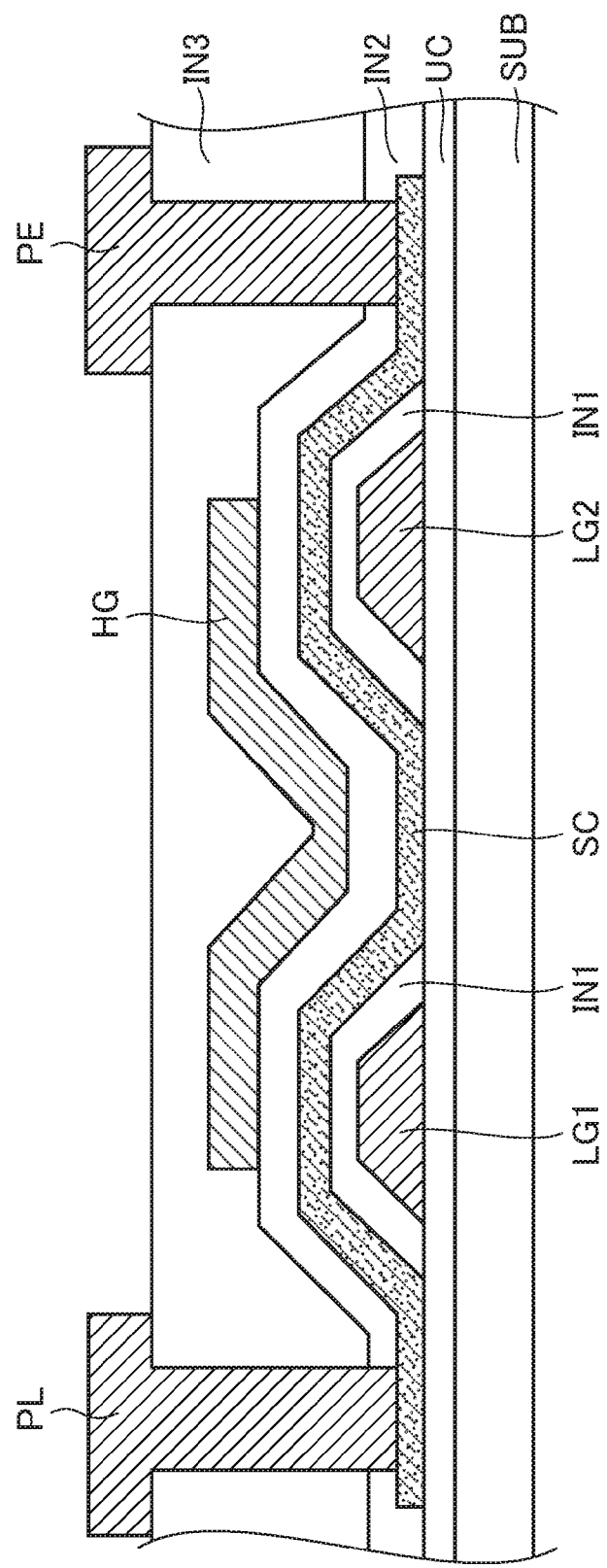
FIG. 6 is a cross-sectional view showing another example of the thin film transistor.

The shape of the thin film transistor TFT2 may be different from that described above. FIG. 6 is a cross-sectional view showing another example of the thin film transistor TFT2, along a section line corresponding to the section line V-V of FIG. 4. The order of the layers constituting the thin film transistor TFT2 shown in FIG. 6 is similar to the example of FIG. 5. Moreover, the shapes or the like of configurations that will not be specifically described below are also similar to those of the example of FIGS. 4 and 5. Unlike the example of FIGS. 4 and 5, in the example of FIG. 6, the lower gate electrodes LG1 and LG2 have a tapered shape in which the lower gate electrodes LG1 and LG2 obliquely descend at the edges as viewed in the direction along the channel length. By forming the lower gate electrodes LG1 and LG2 into the tapered shape, it is possible to further suppress the possibility of occurrence of problems such as a crack in the gate insulating layer IN1 or the channel semiconductor film SC on the lower gate electrodes LG1 and LG2.

Figure 7:
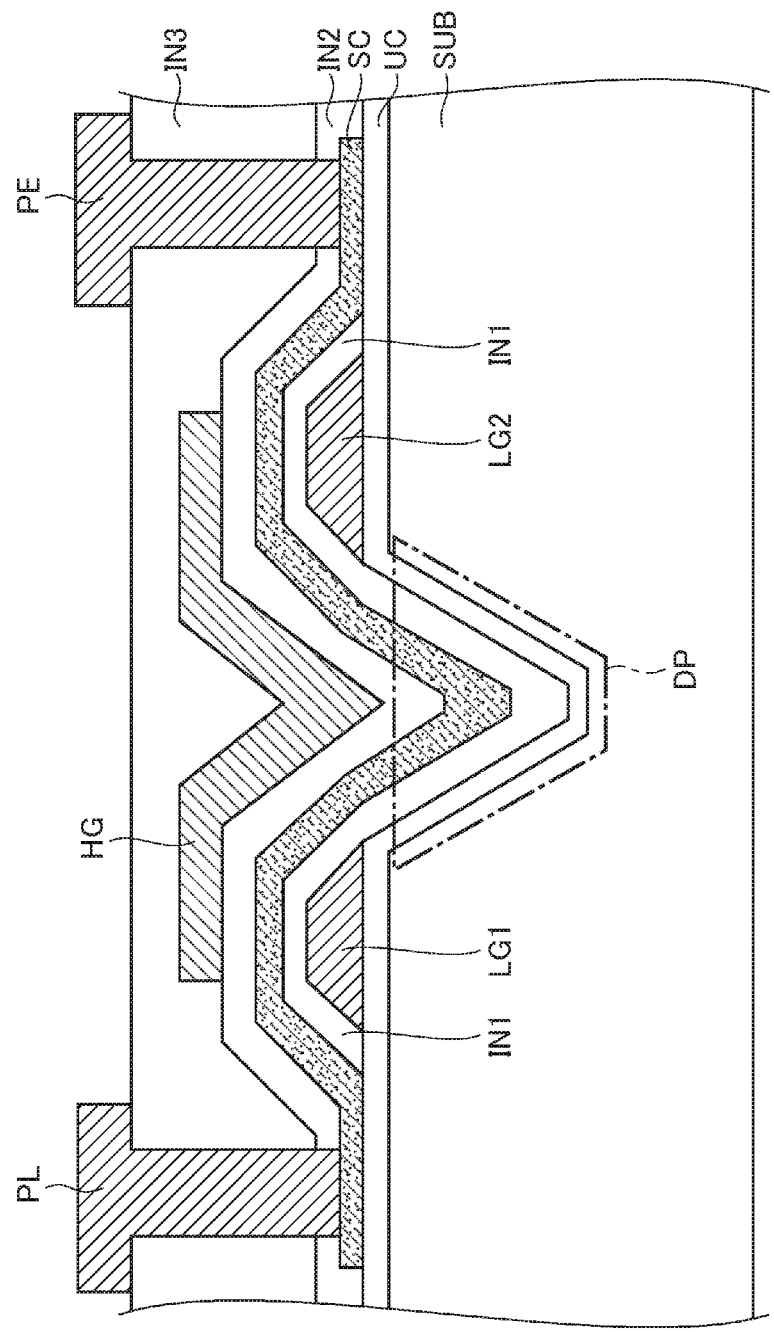
FIG. 7 is a cross-sectional view showing another example of the thin film transistor.

FIG. 7 is a cross-sectional view showing another example of the thin film transistor TFT2. The cross-sectional view shown in FIG. 7 shows a cross-section along a section line corresponding to the section line V-V of FIG. 4. In the example of FIG. 7, a depressed region DP is provided between the lower gate electrodes LG1 and LG2, in the layer below the first conductive layer formed so as to include the lower gate electrodes LG1 and LG2. In the depressed region DP, a recess resulting from the removal of the upper surface of the array substrate SUB is formed. The under layer UC on the array substrate SUB also includes a recess that is dented in a V-shape under the channel region. With this recess, the channel region of the channel semiconductor film SC includes a projection that projects to the side of the array substrate SUB, and the projection has a V-shape in cross-section. Moreover, as viewed in the direction along the channel length, each of the lower gate electrodes LG1 and LG2 has the tapered shape in which the lower gate electrodes LG1 and LG2 obliquely descend at the edges.

In the example of FIG. 7, compared with the example of FIG. 4 or the like, the recess further deepens due to the depressed region DP, so that the channel length of the channel region can be further lengthened. With this configuration, compared with the example of FIG. 4 or 5, impact ions at the drain end are further reduced, and it is possible to further suppress the occurrence of the kink phenomenon.

Figure 8:
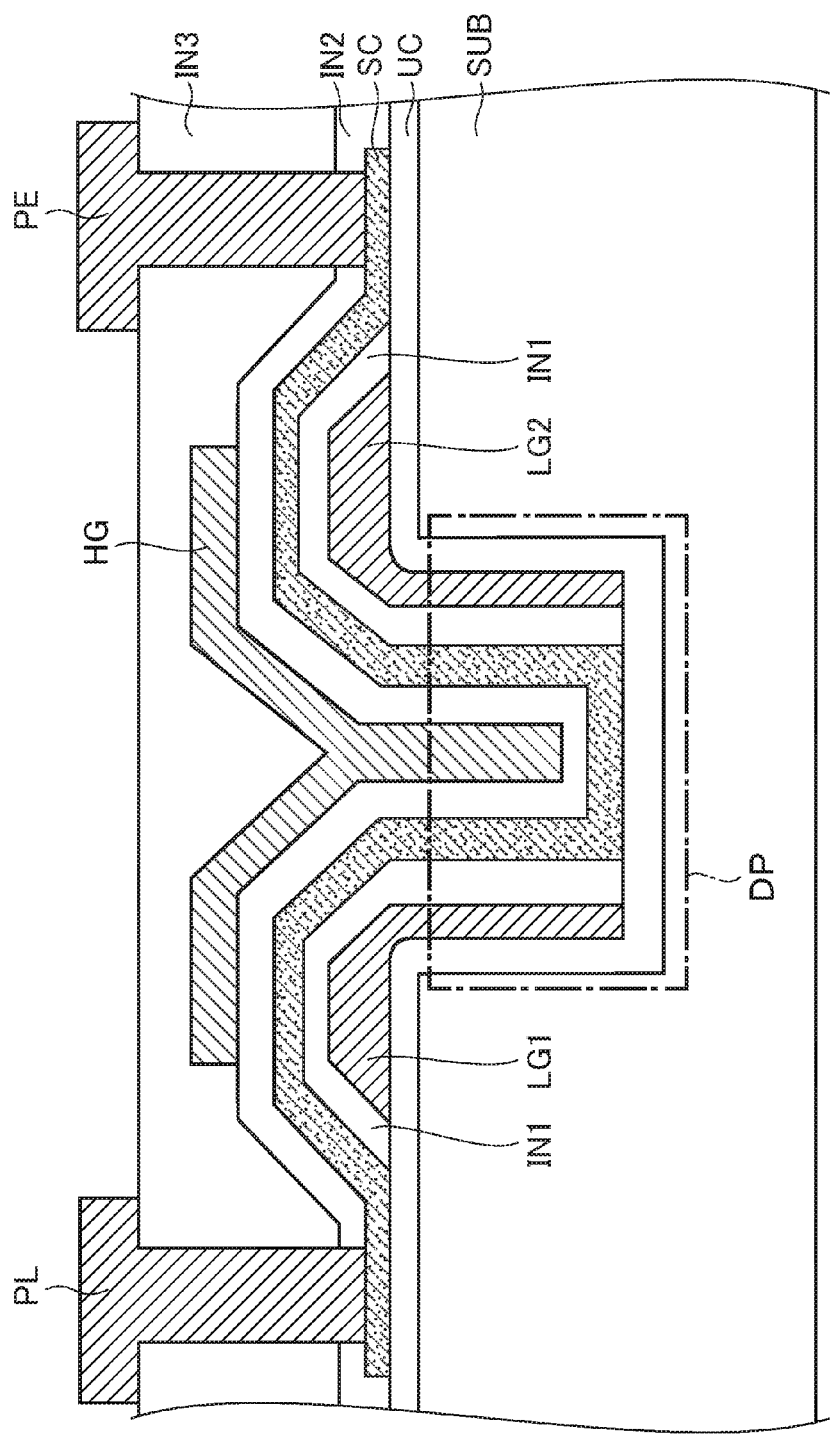
FIG. 8 is a cross-sectional view showing another example of the thin film transistor.

FIG. 8 is a cross-sectional view showing another example of the thin film transistor TFT2. The cross-sectional view shown in FIG. 8 shows a cross-section along a section line corresponding to the section line V-V of FIG. 4. Unlike the example of FIG. 7, the depressed region DP includes a side surface and a bottom surface in the example of FIG. 8. The lower gate electrodes LG1 and LG2 are provided so as to extend along the side surface of the depressed region DP. Moreover, the lower gate electrodes LG1 and LG2 are provided so as to extend while avoiding the bottom surface of the depressed region DP. The portions of the lower gate electrodes LG1 and LG2 extending along the side surface of the depressed region DP are covered by the gate insulating layer IN1. The edges of the lower gate electrodes LG1 and LG2 located outside the depressed region DP have the tapered shape.

The channel region of the channel semiconductor film SC includes, in the depressed region DP, a projection that extends along the side surface and the bottom surface of the depressed region DP, and the projection has a U-shape in cross-section. The channel region is in contact with the under layer UC at the bottom surface of the depressed region DP. Also the gate insulating layer IN2 includes, in the depressed region DP, a projection that extends along the side surface and the bottom surface of the depressed region DP, and the projection has a U-shape in cross-section. The upper gate electrode HG is provided so as to be buried in a slit-like depression that is formed by the gate insulating layer IN2 in the depressed region DP. The upper gate electrode HG branches off into a portion on the source end side and a portion on the drain end side outside the depressed region DP.

In the example of FIG. 8, since the lower gate electrodes LG1 and LG2 are also provided in the depressed region DP, the thin film transistor TFT2 can be driven at a lower voltage compared with the example of FIG. 7. Compared with the example of FIG. 7, also since the channel length is long, impact ions at the drain end are further reduced, and it is possible to further suppress the occurrence of the kink phenomenon.

Figure 9:
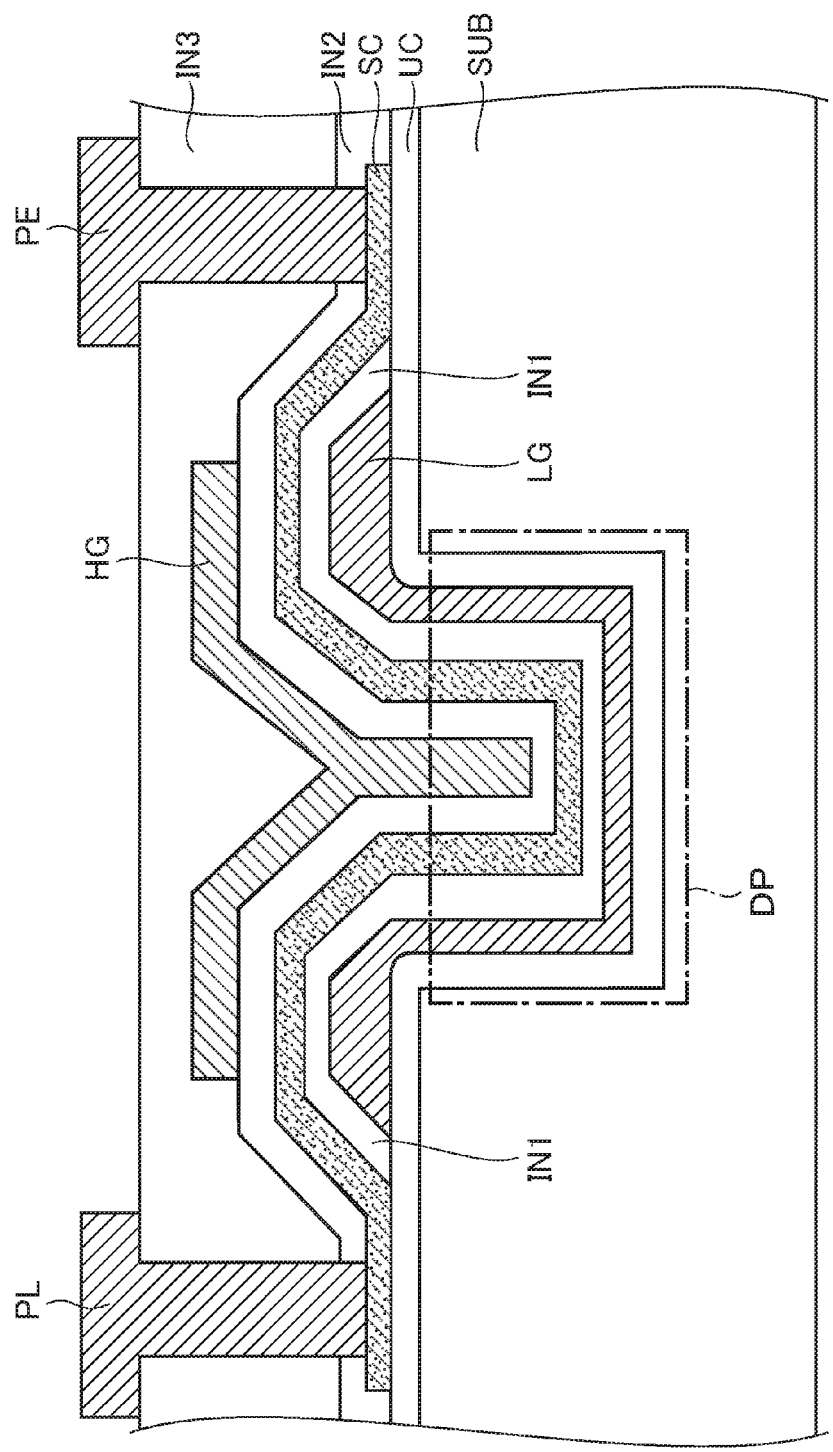
FIG. 9 is a cross-sectional view showing another example of the thin film transistor.

Here, the lower gate electrodes LG1 and LG2 may not be separated from each other. FIG. 9 is a cross-sectional view showing another example of the thin film transistor TFT2. The cross-sectional view shown in FIG. 9 shows a cross-section along a section line corresponding to the section line V-V of FIG. 4. In the example of FIG. 9, the depressed region DP includes the side surface and the bottom surface, similarly to the example of FIG. 8. In the example of FIG. 9, a lower gate electrode LG is formed of a continuous one portion as viewed in the direction along the channel length, and is not divided under the channel region. The lower gate electrode LG is provided so as to extend along the side surface and the bottom surface of the depressed region DP. The lower gate electrode LG is covered by the gate insulating layer IN1 under the channel region. The edges of the lower gate electrode LG located outside the depressed region DP have the tapered shape.

Even in the example of FIG. 9, irregularities are formed under the channel region in the direction along the channel length, and the channel region three-dimensionally curved due to the irregularities such that the channel length is lengthened. With this configuration, compared with the case where irregularities are absent, impact ions at the drain end are further reduced, and it is possible to further suppress the occurrence of the kink phenomenon.

Second Embodiment

Next, an organic EL display device according to a second embodiment of the invention will be described. In the embodiment, a structure for hole accumulation suppression is provided in the channel region. Hereinafter, the organic EL display device according to the second embodiment will be described focusing on different portions from the first embodiment.

Figure 10:
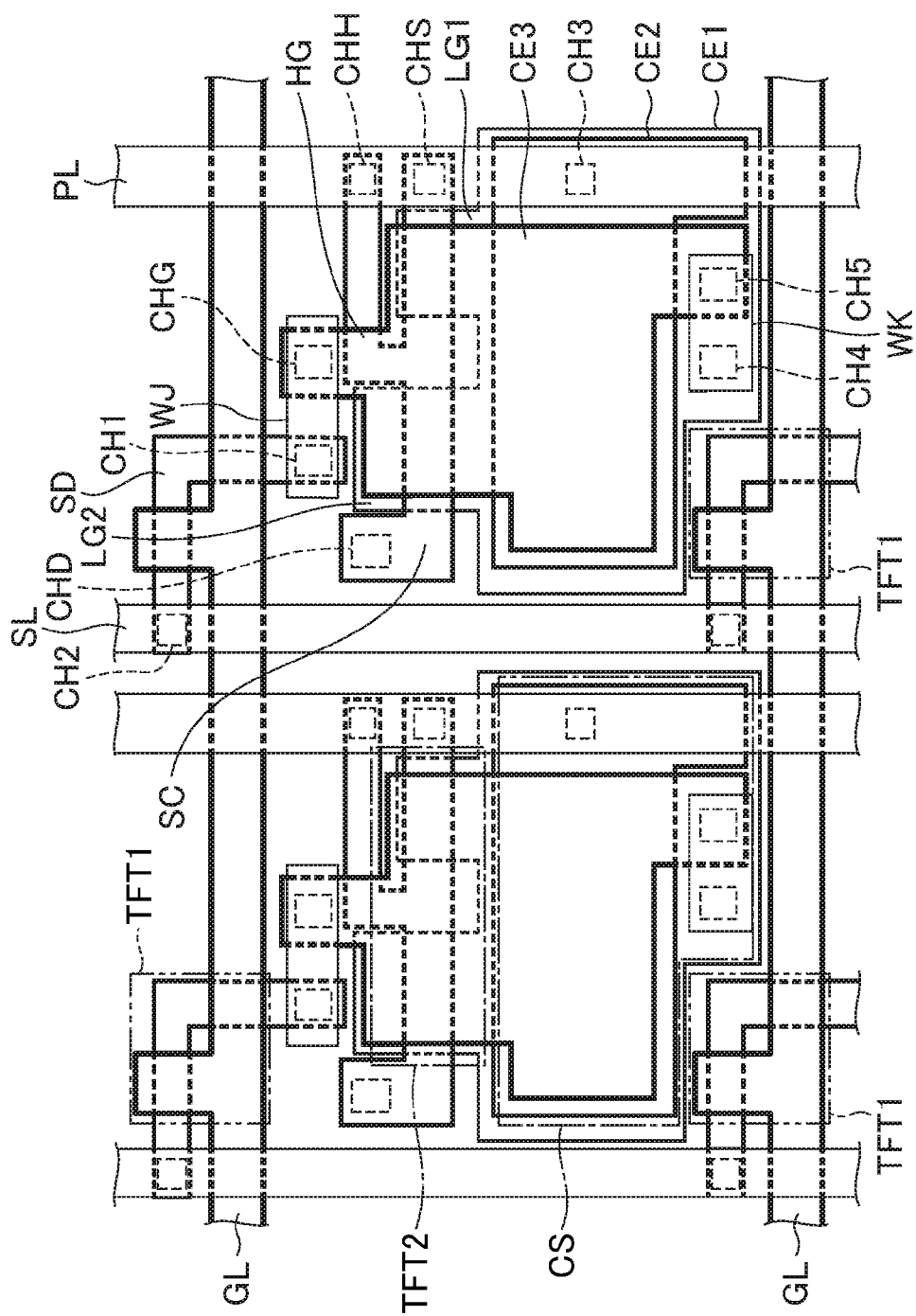
FIG. 10 is a plan view showing one example of a pixel circuit according to a second embodiment.

FIG. 10 is a plan view showing one example of the pixel circuit PC according to the second embodiment. Referring to FIG. 10, the channel semiconductor film SC branches off in the upper direction of FIG. 10 in the channel region relative to FIG. 2, and is connected with the power line PL through a contact hole CHH. Moreover, the end of the branched portion of the channel semiconductor film SC is electrically connected with the source region. The lower gate electrodes LG1 and LG2 are provided so as not to overlap the branched portion of the channel semiconductor film SC in a plan view. Moreover, the lower gate electrodes LG1 and LG2 are not directly connected with the jumper wiring WJ. Instead, at the lower edge of the region where the pixel circuit PC is formed in FIG. 10, the first capacitor electrode CE1 and the third capacitor electrode CE3 are in contact with a jumper wiring WK through contact holes CH4 and CH5, respectively. With this configuration, the lower gate electrodes LG1 and LG2 and the upper gate electrode HG are electrically connected.

Figure 11:
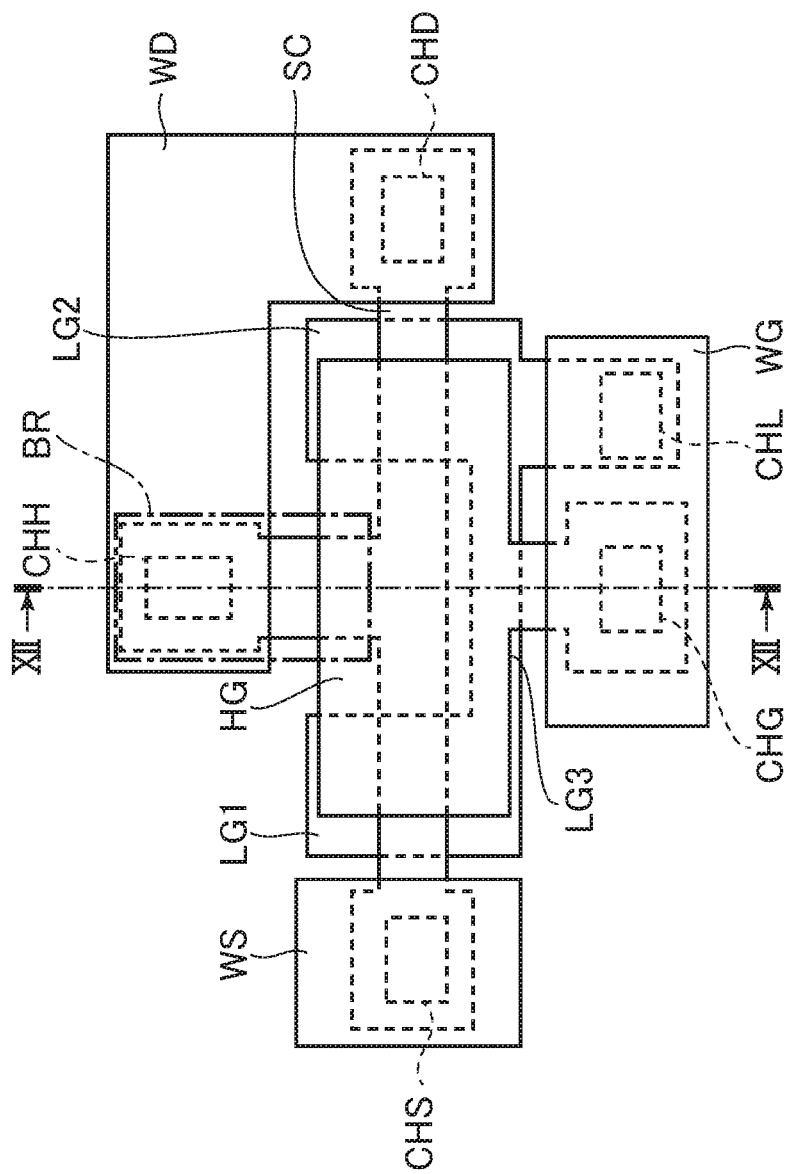
FIG. 11 is a plan view showing a modified example of a thin film transistor according to a second embodiment.
Figure 12:
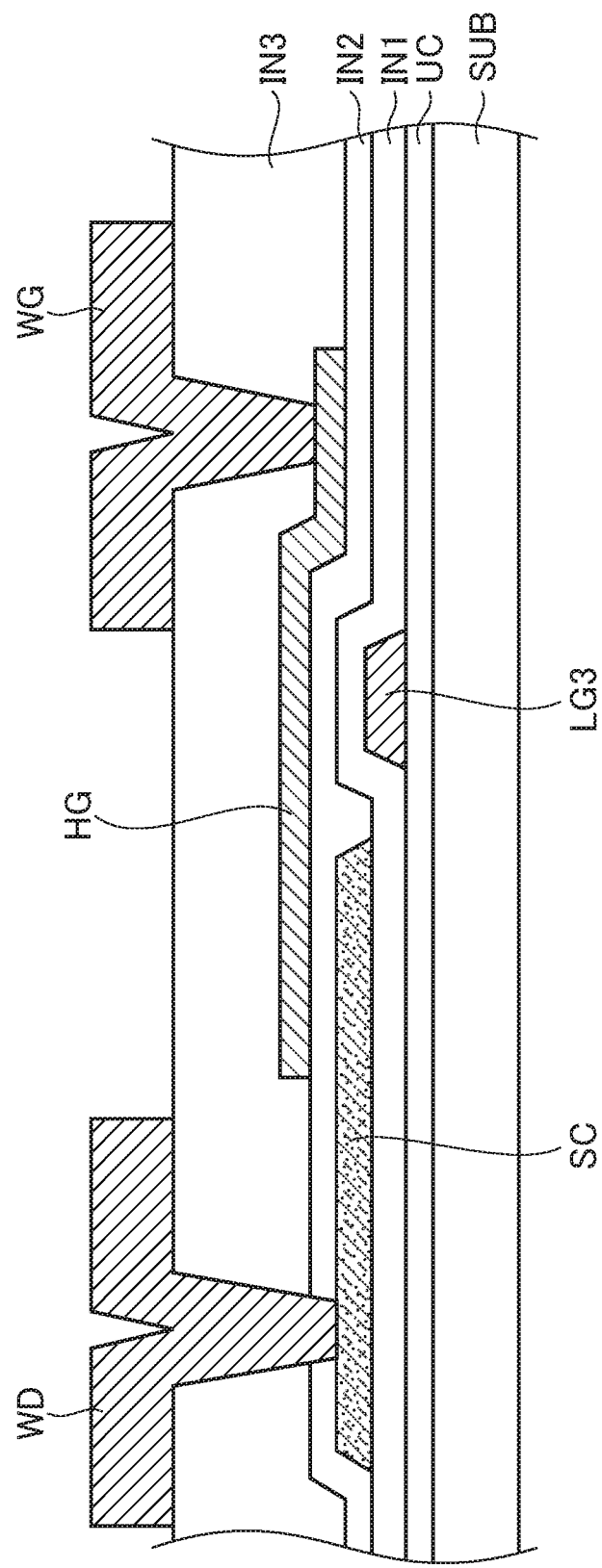
FIG. 12 is a cross-sectional view of the thin film transistor shown in FIG. 11 along the section line XII-XII.

FIG. 11 is a plan view showing a modified example of the thin film transistor TFT2 according to the second embodiment. FIG. 12 is a cross-sectional view of the thin film transistor TFT2 shown in FIG. 11 along the section line XII-XII. The thin film transistor TFT2 shown in FIG. 11 differs from that shown in FIG. 10 in the following three respects. First, the lower gate electrodes LG1 and LG2 and the upper gate electrode HG of the thin film transistor TFT2 do not include portions that are connected with the electrodes of the capacitor CS. Second, the direction in which the channel semiconductor film SC branches off and extends is the opposite direction from the contact hole CHG. Third, the branched tip is electrically connected to the drain region through a wiring WD. Although there are these differences, both the thin film transistors TFT2 shown in FIGS. 10 and 11 exhibit the effect of hole accumulation suppression.

Hereinafter, the thin film transistor TFT2 shown in FIGS. 11 and 12 will be described focusing on differences from the example shown in FIGS. 4 and 5. The channel semiconductor film SC includes a branched portion BR that branches off in the width direction in the channel region. The planar shape of the channel semiconductor film SC is a T-shape. The branched portion BR is connected to the wiring WD through the contact hole CHH, and the wiring WD is connected to the drain region of the channel semiconductor film SC through the contact hole CHD. A wiring WS is in contact with the source end of the channel semiconductor film SC through the contact hole CHS. A wiring WG is in contact with the upper gate electrode HG through the contact hole CHG, and is in contact with the lower gate electrode LG3 through the contact hole CHL. The lower gate electrode LG3 is formed integrally with the lower gate electrodes LG1 and LG2 separated from each other. The branched portion BR may be connected with the source region through the wiring WS. Moreover, this branching off of the channel may be combined with the other examples of the thin film transistor TFT2.

Here, the branched portion BR includes a channel region that planarly overlaps the upper gate electrode HG. The channel region of the branched portion BR may have a structure in which the channel region planarly overlaps any of the lower gate electrodes LG1, LG2, and LG3.

In the example of FIGS. 11 and 12, in addition to the effect shown in the example of FIG. 4, the effect of hole accumulation suppression due to the branched portion BR is added, and it is possible to further suppress the occurrence of the kink phenomenon. Since the TFT structure of the invention has the effect of greatly improving transistor characteristics, the TFT structure may be applied to the thin film transistor TFT1, the thin film transistor TFT2, and the circuits of the driver circuits YDV and XDV shown in FIG. 1.

Third Embodiment

Next, an organic EL display device according to a third embodiment of the invention will be described. In the embodiment, the channel length is further increased by also using a spacer SP (see FIGS. 14, 15, etc.) formed on the channel semiconductor film SC. Hereinafter, the organic EL display device according to the third embodiment will be described focusing on portions different from the first embodiment, particularly differences in the structure of the thin film transistor TFT2.

Figure 14:
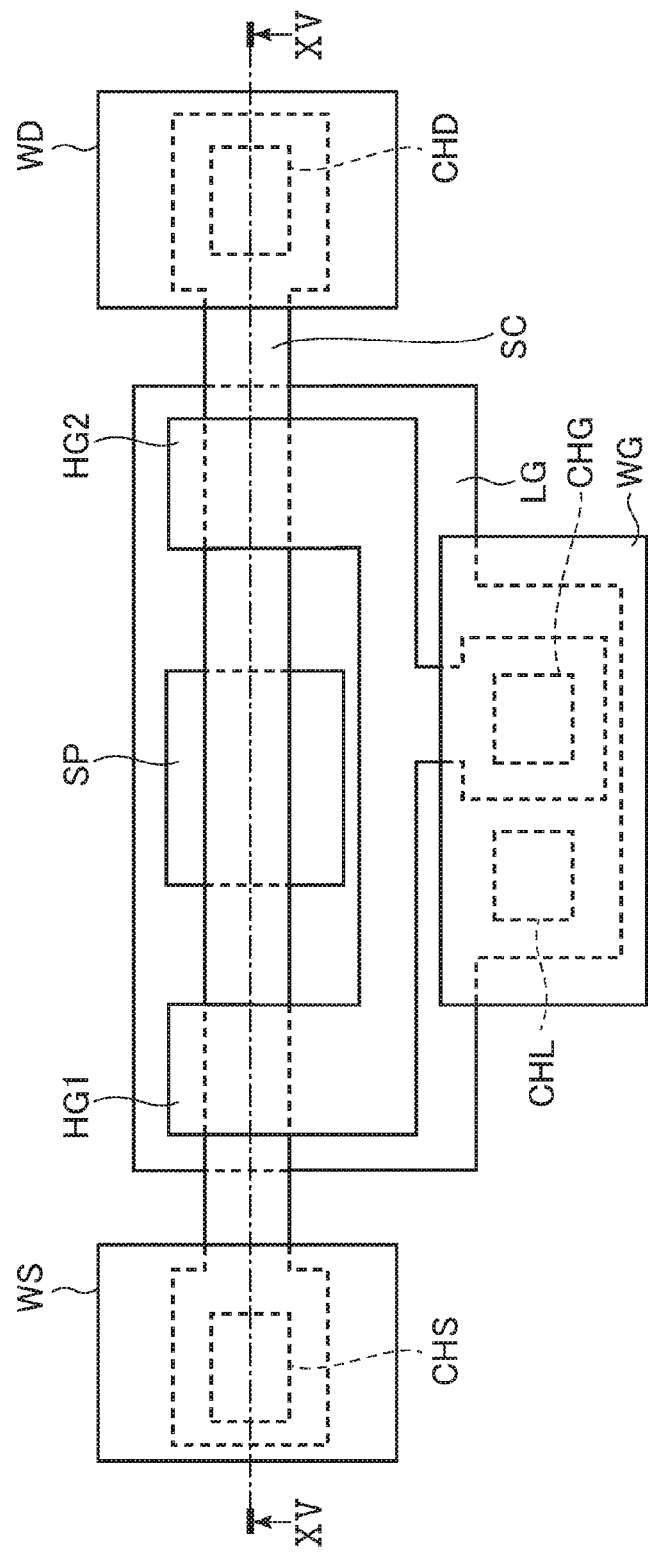
FIG. 14 is a plan view showing one example of a thin film transistor according to a third embodiment.
Figure 15:
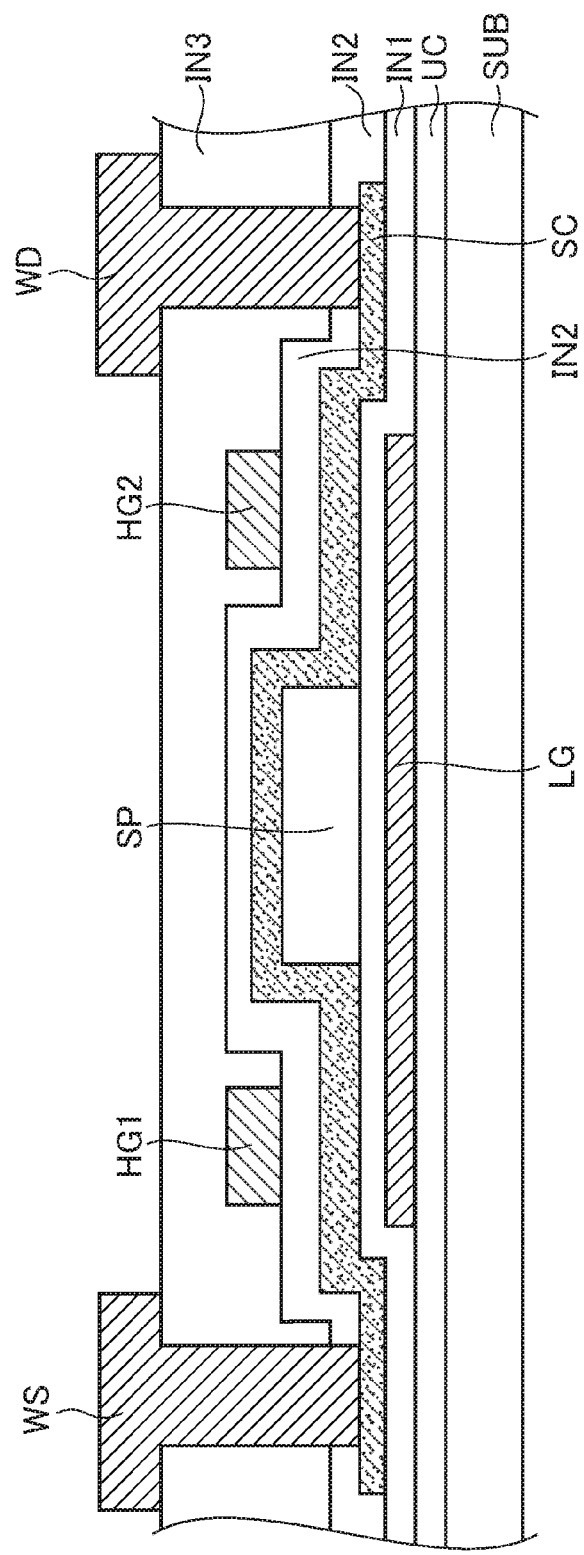
FIG. 15 is a cross-sectional view along the section line XV-XV of FIG. 14.

FIG. 14 is a plan view showing one example of the thin film transistor TFT2 according to the third embodiment. FIG. 15 is a cross-sectional view of the thin film transistor TFT2 shown in FIG. 14 along the section line XV-XV.

The thin film transistor TFT2 shown in FIG. 14 includes the lower gate electrode LG provided on the under layer UC, the channel semiconductor film SC, upper gate electrodes HG1 and HG2, and the spacer SP. The channel semiconductor film SC is provided above the lower gate electrode LG. The upper gate electrodes HG1 and HG2 are provided above the channel semiconductor film SC. The channel semiconductor film SC extends from the drain end to the source end. At the drain end, the channel semiconductor film SC is in contact with the wiring WD through the contact hole CHD. At the source end, the channel semiconductor film SC is in contact with the wiring WS through the contact hole CHS. Moreover, the channel semiconductor film SC includes a channel portion between the drain end and the source end. The channel portion has a band shape in a plan view. Similarly to the example of FIG. 4, in the region of the channel semiconductor film SC from the source end to the drain end, a portion that planarly overlaps the lower gate electrode LG or the upper gate electrode HG1 or HG2 is described as "channel region", a portion on the drain end side in a region of the channel semiconductor film SC that is not the channel region is described as "drain region", and a region on the source end side is described as "source region".

The lower gate electrode LG and the upper gate electrodes HG1 and HG2 constitute a gate electrode of the thin film transistor TFT2. In the example of FIG. 14, in a plan view, the lower gate electrode LG is disposed so as to contain the upper gate electrodes HG1 and HG2 and the spacer SP, and is in contact with the wiring WG through the contact hole CHL on the lower side of FIG. 14. The upper gate electrodes HG1 and HG2 are rectangular regions that are separated from each other. The upper gate electrodes HG1 and HG2 are connected to each other on the lower side of FIG. 14, and are in contact with the wiring WG through the contact hole CHG. The spacer SP is provided between the channel semiconductor film SC and the lower gate electrode LG, and, in a plan view, between the upper gate electrode HG1 and the upper gate electrode HG2. More specifically, the spacer SP is an insulating film, and is disposed between the gate insulating layer IN1 and the channel semiconductor film SC. In a plan view, the channel region overlaps the upper gate electrode HG1, the spacer SP, and the upper gate electrode HG2 in this order from the source region side. Moreover, the channel region and the lower gate electrode LG overlap between a position on the source region side from the upper gate electrode HG1 and a position on the drain region side from the upper gate electrode HG2.

The lower gate electrode LG faces the channel semiconductor film SC with the gate insulating layer IN1 therebetween, and the upper gate electrodes HG1 and HG2 face the channel semiconductor film SC with the gate insulating layer IN2 therebetween. The lower gate electrode LG and the channel region face each other with the gate insulating layer IN1 and the spacer SP therebetween particularly at the portion where the spacer SP and the channel region overlap. A projection is formed due to the spacer SP, and therefore, a projection is also formed in the channel region located on the spacer SP.

The channel region of the channel semiconductor film SC includes: an overlapped facing region where the channel region faces both the lower gate electrode LG and any of the upper gate electrodes HG1 and HG2; and a one-side facing region where the channel region faces only one of the lower gate electrode LG and the upper gate electrodes HG1 and HG2 and which is located outside the overlapped facing region as viewed in the direction along the channel length. Moreover, as viewed in the direction along the channel length, the one-side facing region is present on the side of the overlapped facing region opposite to the central portion of the channel region. In another perspective, as viewed in the direction along the channel length, the positions of the edges of the lower gate electrode LG are shifted from the positions of the source-side edge and the drain-side edge of the upper gate electrodes HG1 and HG2. More specifically, in the example of FIGS. 14 and 15, the edge of the lower gate electrode LG is located outside the edge of one of the upper gate electrodes HG1 and HG2. That is, in a plan view, the edges of the lower gate electrode LG overlap the edges of the channel region, and the edges of the upper gate electrodes HG1 and HG2 are located inside the edges of the channel region.

In the example of FIGS. 14 and 15, the channel length is increased due to the projection formed by the spacer SP in the channel region of the channel semiconductor film Sc. With this configuration, compared with the case where the spacer SP is absent, impact ions at the drain end are reduced, and it is possible to suppress the occurrence of the kink phenomenon.

Figure 16:
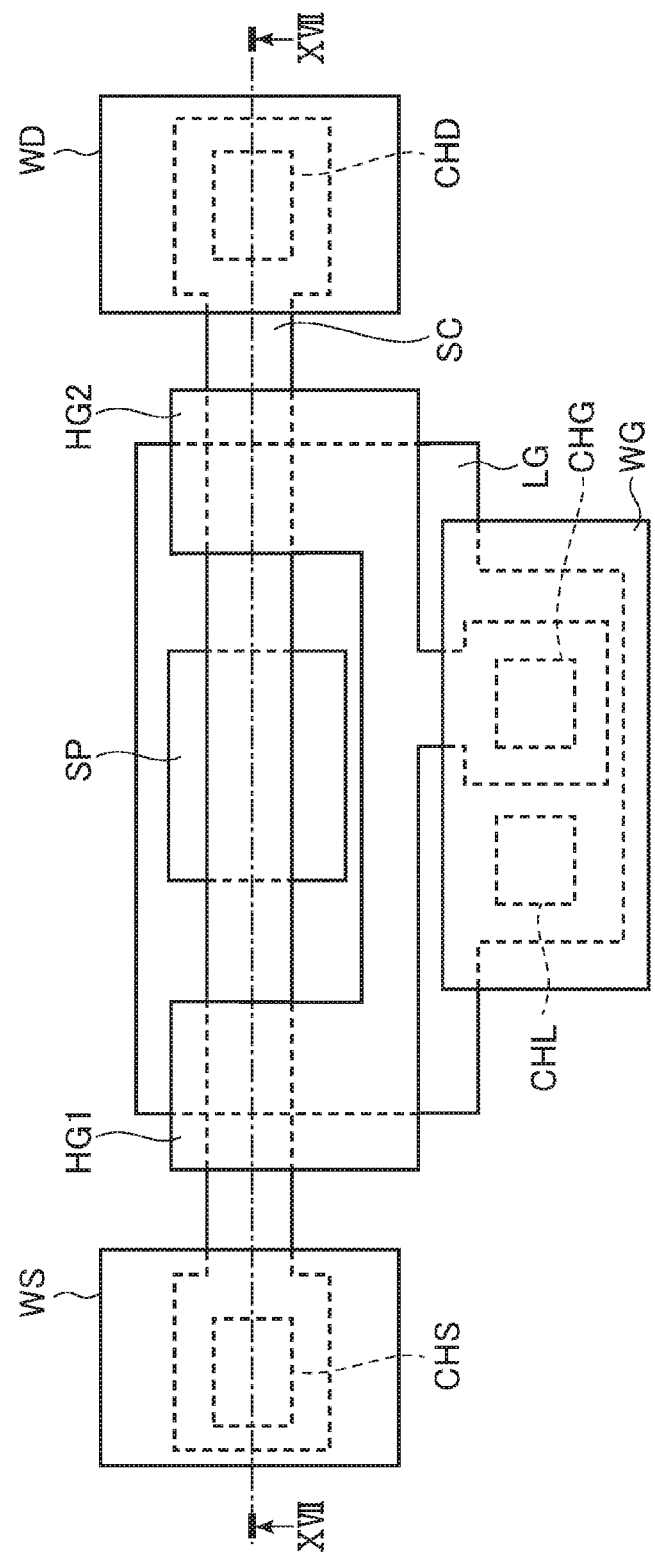
FIG. 16 is a plan view showing another example of the thin film transistor.
Figure 17:
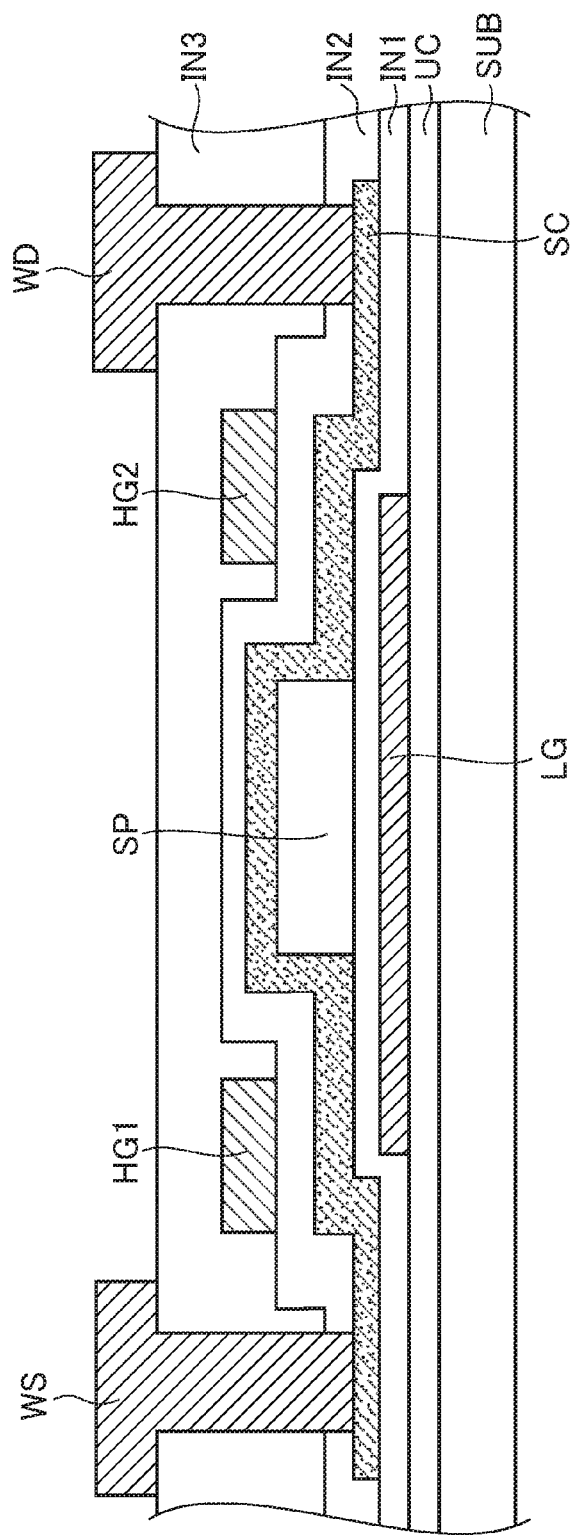
FIG. 17 is a cross-sectional view along the section line XVII-XVII of FIG. 16.

Here, in the example of FIGS. 14 and 15, the edges of the lower gate electrode LG are located outside the respective outer edges of the upper gate electrodes HG1 and HG2; however, this structure may not necessarily be employed. FIG. 16 is a plan view showing another example of the thin film transistor TFT2. FIG. 17 is a cross-sectional view of the thin film transistor TFT2 shown in FIG. 16 along the section line XVII-XVII. This example differs from that of FIGS. 14 and 15 mainly in that the outer edge of at least one of the upper gate electrodes HG1 and HG2 is located outside the edge of the lower gate electrode LG. In the structure shown in FIGS. 16 and 17, in a plan view, the edges of the upper gate electrodes HG1 and HG2 overlap the edges of the channel region, and the edges of the gate electrode LG are located inside the edges of the channel region. Also in the example of FIGS. 16 and 17, the channel length is increased due to the projection formed by the spacer SP in the channel region of the channel semiconductor film SC, and it is possible to suppress the occurrence of the kink phenomenon.

Figure 18:
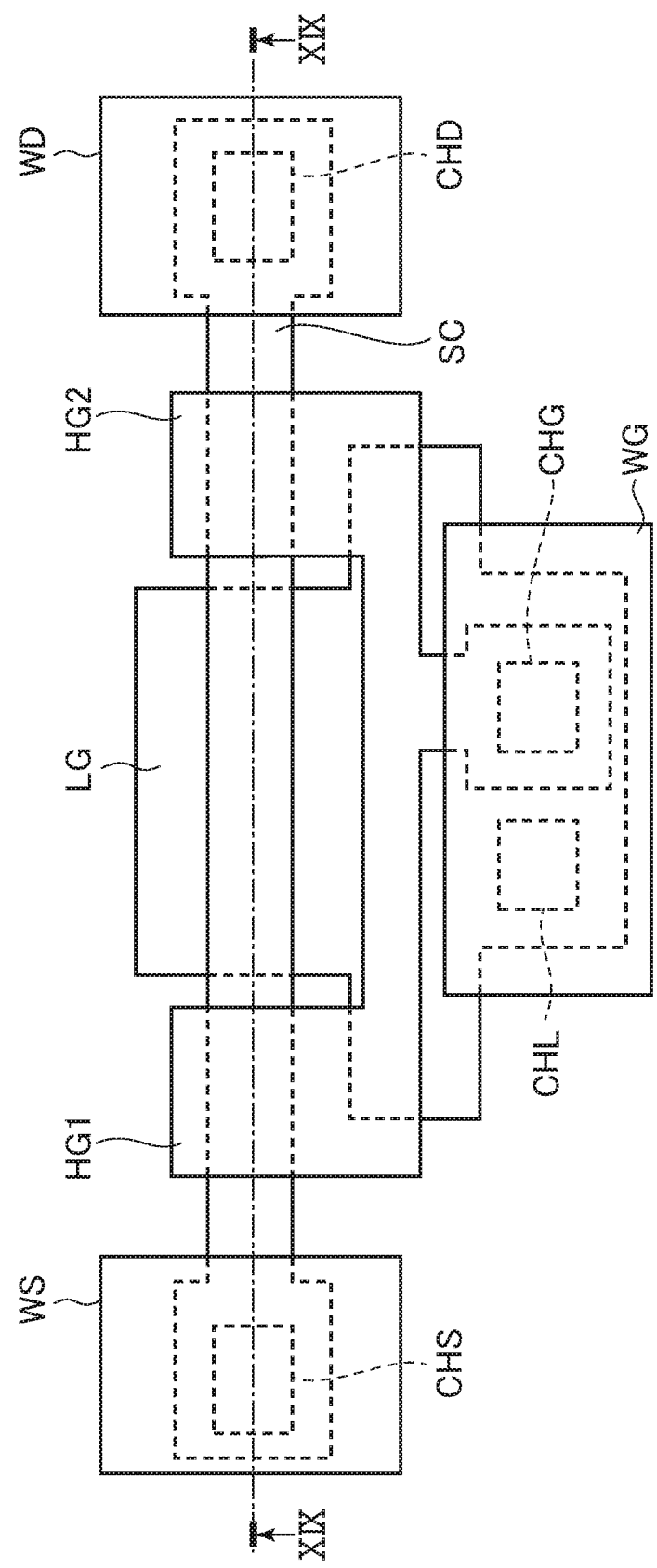
FIG. 18 is a plan view showing another example of the thin film transistor.

FIG. 18 is a plan view showing another example of the thin film transistor TFT2. FIG. 19 is a cross-sectional view of the thin film transistor TFT2 shown in FIG. 18 along the section line XIX-XIX. Unlike the example of FIGS. 16 and 17, the spacer SP is not present in the example of FIGS. 18 and 19. On the other hand, the lower gate electrode LG is located between the upper gate electrodes HG1 and HG2 in a plan view. In a region where the channel semiconductor film SC is present, the lower gate electrode LG does not overlap the upper gate electrodes HG1 and HG2 in a plan view. The length of a portion of the lower gate electrode LG overlapping the channel semiconductor film SC in the channel direction is smaller than a length from the inner edge of the upper gate electrode HG1 to the inner edge of the upper gate electrode HG2. In the example of FIGS. 18 and 19, the channel length is increased due to a projection that is formed by the lower gate electrode LG in the channel region of the channel semiconductor film SC, and it is possible to suppress the occurrence of the kink phenomenon.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
a pixel including a thin film transistor; and
an under layer provided below the thin film transistor, wherein
the thin film transistor includes a first gate electrode provided on the under layer, a semiconductor layer provided above the first gate electrode, and a second gate electrode provided above the semiconductor layer,
the semiconductor layer includes a channel region that overlaps at least one of the first gate electrode and the second gate electrode in a plan view,
the channel region curves in a thickness direction of the semiconductor layer,
the first gate electrode includes a first edge located on a side of an edge of the channel region in a direction of a channel length of the thin film transistor,
the second gate electrode includes a second edge located on a side of the edge of the channel region, and
a position of the first edge in the direction of the channel length is different from a position of the second edge in the direction of the channel length in the plan view.
2. The display device according to claim 1, wherein
one of the first gate electrode and the second gate electrode includes a first region and a second region that overlap the channel region in the plan view, and
the first region is separated from the second region.
3. The display device according to claim 2, wherein
the one of the first gate electrode and the second gate electrode includes a third region that does not overlap the semiconductor layer, and the third region is in contact with both of the first region and the second region.

4. The display device according to claim 2, wherein
the first gate electrode includes the first region and the second region, and
the channel region includes a first projection over the first region and projects to a side of the second gate electrode, and a second projection over the second region and projects to a side of the second gate electrode.

5. The display device according to claim 4, wherein
the channel region includes a fourth region between the first region and the second region,
the fourth region includes a third projection that projects to a side of the under layer, and
the second gate electrode includes a fourth projection that overlaps the fourth region and projects to a side of the under layer.

6. The display device according to claim 5, further comprising a substrate on which the under layer is disposed, wherein
the substrate includes a depressed region that overlaps the fourth region and is depressed to a side opposite to the under layer, and
a portion of the third projection is located in the depressed region.

7. The display device according to claim 6, wherein
the depressed region includes a side surface and a bottom surface that connects to the side surface,
a portion of the first region and a portion of the second region are located along the side surface, and
a portion of the channel region is located along the side surface and the bottom surface.

8. The display device according to claim 1, further comprising a substrate on which the under layer is disposed, wherein
the substrate includes a depressed region that is depressed to a side opposite to the under layer,
the depressed region includes a side surface and a bottom surface that connects to the side surface,
a portion of the first gate electrode is located along the side surface and the bottom surface, and continuously extends from the depressed region to an outside of the depressed region,
a portion of the channel region is located along the side surface and the bottom surface, and continuously extends from the depressed region to the outside of the depressed region, and
a portion of the second gate electrode is located in the depressed region.

9. The display device according to claim 1, wherein
the semiconductor layer includes a source region and a drain region, and includes a branched portion that extends from the channel region in a direction different from a direction from the channel region to the source region and a direction from the channel region to the drain region, and
the branched portion is connected with one of the source region and the drain region through a wiring disposed in a layer different from the semiconductor layer.

10. The display device according to claim 9, wherein
a portion of the branched portion overlaps one of the first gate electrode and the second gate electrode in a plan view.

11. The display device according to claim 9, further comprising:
a light-emitting element included in the pixel and including an anode and a cathode; and
a power line connected with the anode through the thin film transistor, wherein
the source region is connected with the power line,
the drain region is connected with the anode, and
the branched portion is connected with the source region through the power line.

12. The display device according to claim 9, further comprising:
a light-emitting element included in the pixel and including an anode and a cathode; and
a power line connected with the anode through the thin film transistor, wherein
the source region is connected with the power line,
the drain region is connected with the anode, and
the branched portion is connected with the drain region through the wiring.

13. The display device according to claim 2, wherein
the second gate electrode includes the first region and the second region,
the channel region includes a fourth region between the first region and the second region, and
the fourth region includes a third projection that projects to a side of the second gate electrode.

14. The display device according to claim 13, wherein
a gate insulating film is disposed between the first gate electrode and the semiconductor layer,
a spacer that projects to a side of the channel region is disposed at a position of the gate insulating film overlapping the fourth region, and
the third projection straddles over the spacer.

15. The display device according to claim 2, wherein
the second gate electrode includes the first region and the second region,
the semiconductor layer includes a fourth region between the first region and the second region,
the first edge is located between a central portion of the fourth region in the direction of the channel length and the second edge, and
a length of the fourth region in the direction of the channel length is larger than a length of the first gate electrode in the direction of the channel length.

16. The display device according to claim 15, wherein
in an area where the semiconductor layer is located in a plan view, the first gate electrode does not overlap the second gate electrode.

17. The display device according to claim 1, wherein
an edge of the first gate electrode has a tapered shape.

18. The display device according to claim 1, wherein
the first gate electrode and the second gate electrode are electrically connected.

19. The display device according to claim 1, further comprising:
a capacitor included in the pixel; a first gate insulating film located between the first gate electrode and the semiconductor layer; and a second gate insulating film located between the semiconductor layer and the second gate electrode, wherein
the capacitor includes a first capacitor electrode formed integrally with the first gate electrode, the first gate insulating film, a second capacitor electrode formed of a semiconductor material located at a same layer as the semiconductor layer, the second gate insulating film, and a third capacitor electrode formed integrally with the second gate electrode.

20. A display device comprising:
a pixel including a thin film transistor; and
an under layer provided below the thin film transistor, wherein
the thin film transistor includes a first gate electrode provided on the under layer, a first semiconductor layer provided above the first gate electrode, and a second gate electrode provided above the first semiconductor layer,
the first semiconductor layer includes a channel region that overlaps at least one of the first gate electrode and the second gate electrode in a plan view,
a first gate insulating film is disposed between the first gate electrode and the first semiconductor layer,
a second gate insulating film is disposed between the first semiconductor layer and the second gate electrode,
a second semiconductor layer located separately from the first semiconductor layer is disposed in a same layer as the first semiconductor layer,
the first gate electrode includes a first portion that overlaps the second semiconductor layer in the plan view,
the second gate electrode includes a second portion that overlaps the first portion in the plan view,
the first gate insulating film is located between the first portion and the second semiconductor layer,
the second gate insulating film is located between the second semiconductor layer and the second portion,
the first gate electrode includes a first edge located on a side of an edge of the channel region in a direction of a channel length of the thin film transistor,
the second gate electrode includes a second edge located on a side of the edge of the channel region, and
a position of the first edge in the direction of the channel length is different from a position of the second edge in the direction of the channel length in the plan view.

* * * * *